(12) United States Patent
Jackson

(10) Patent No.: US 7,219,677 B1
(45) Date of Patent: May 22, 2007

(54) METHOD AND APPARATUS FOR SUPERCRITICAL OZONE TREATMENT OF A SUBSTRATE

(76) Inventor: David P Jackson, 22328 Barcotta Dr., Saugus, CA (US) 91350

( * ) Notice: Subject to any disclaimer, the term of this patent is extended or adjusted under 35 U.S.C. 154(b) by 622 days.

(21) Appl. No.: 10/343,734

(22) PCT Filed: Jul. 31, 2001

(86) PCT No.: PCT/US01/24185

§ 371 (c)(1),
(2), (4) Date: Jan. 30, 2003

(87) PCT Pub. No.: WO02/11191

PCT Pub. Date: Feb. 7, 2002

(51) Int. Cl.
*B08B 3/00* (2006.01)

(52) U.S. Cl. .................. 134/94.1; 134/100.1; 134/902

(58) Field of Classification Search ............... 134/94.1, 134/95.3, 98.1, 100.1, 103.1, 902
See application file for complete search history.

(56) References Cited

U.S. PATENT DOCUMENTS

| | | | |
|---|---|---|---|
| 6,242,165 B1* | 6/2001 | Vaartstra | 430/329 |
| 6,532,974 B2* | 3/2003 | Kashkoush et al. | 134/56 R |
| 6,558,477 B1* | 5/2003 | Scovell | 134/30 |

FOREIGN PATENT DOCUMENTS

WO    WO-96/23606    * 8/1996

* cited by examiner

*Primary Examiner*—Michael Barr
*Assistant Examiner*—Saeed Chaudhry

(57) ABSTRACT

Disclosed is a method and apparatus for treating a substrate with a reaction solvent formed of supercritical ozone in a feed phase. The feed phase can be aqueous, e.g., formed of heated, deionized water, nonaqueous, e.g., formed of a dense fluid, such as supercritical carbon dioxide, liquid carbon dioxide, supercritical nitrogen or combinations the dense fluids or the feed phase can be a mixture of aqueous and nonaqueous phases.

18 Claims, 25 Drawing Sheets

INTEGRATED DENSE FLUID OXIDATION CLEANING, DRYING AND PROCESS FLUIDS MANAGEMENT SYSTEM

OVERVIEW OF MAJOR MODULES

MIXED PHASE DIAGRAM FOR $N_2$, $H_2O$, $O_3$ AND $CO_2$

INTERFACIAL SURFACE FREE ENERGY

INTERFACIAL CONTAMINANT SWELL AND PERMEATION

COHESION ENERGIES OF CARBON DIOXIDE-WATER MIXTURES

REACTION MODIFIERS

INTEGRATED DENSE FLUID OXIDATION CLEANING, DRYING AND PROCESS FLUIDS MANAGEMENT SYSTEM

OVERVIEW OF MAJOR MODULES

FIG. 13
EXEMPLARY DENSE FLUID OZONATORS
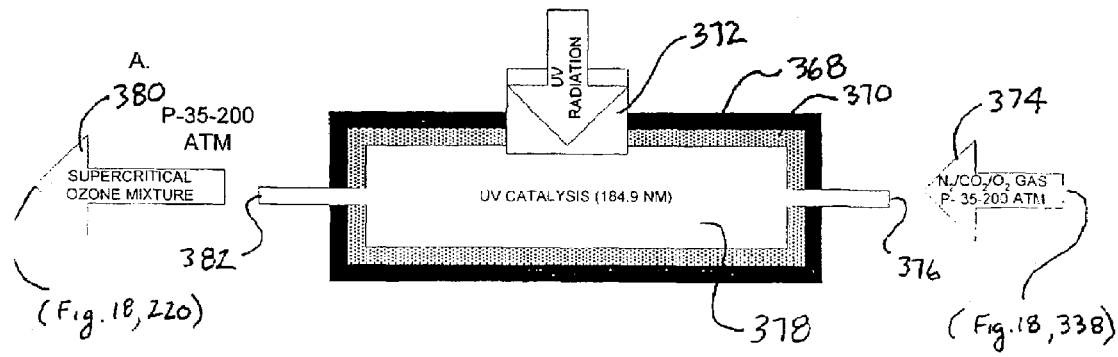
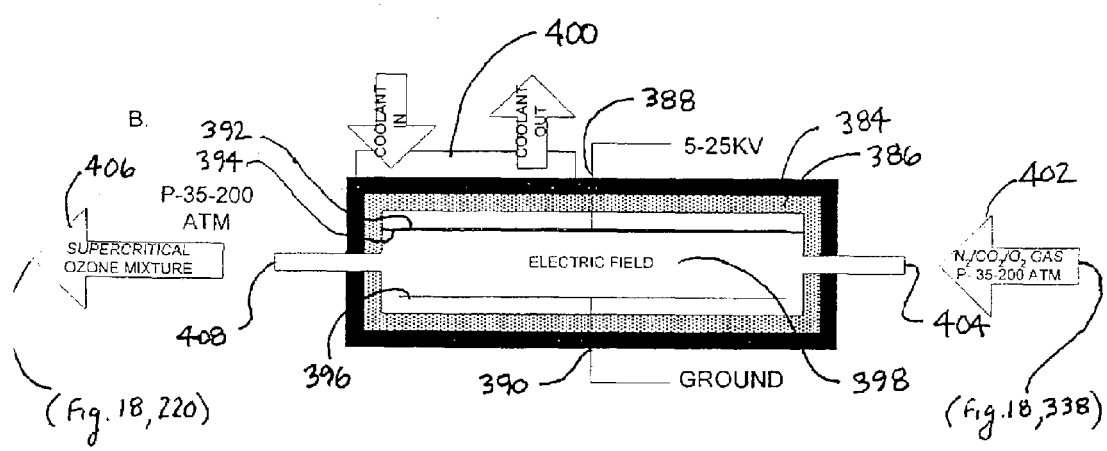
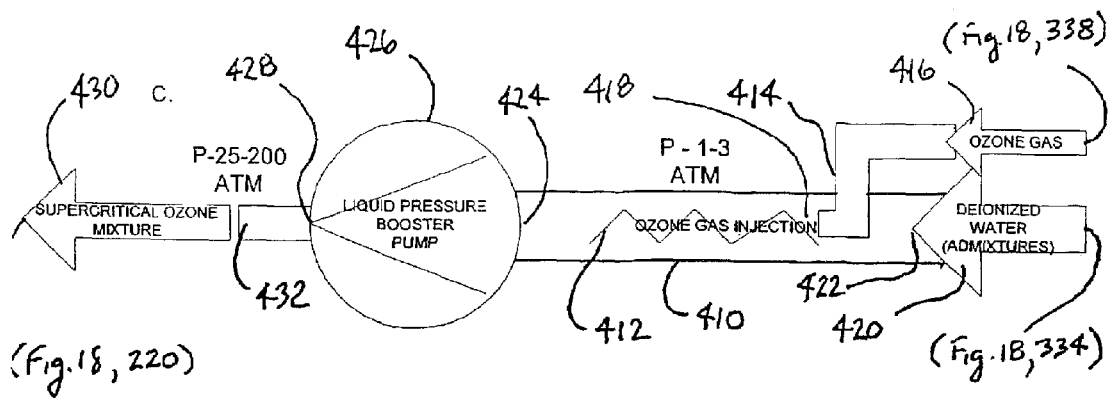

EXEMPLARY PROCESS FLOWCHART

EXEMPLARY PROCESS DYNAMICS

EXAMPLE DENSE FLUID
OXIDATION PROCESS
Water-$CO_2$-Ozone

EXAMPLE DENSE FLUID OXIDATION PROCESS
Water-$N_2$-Ozone

EXAMPLE DENSE FLUID
OXIDATION PROCESS
Water-$CO_2$-Ozone-$H_2O_2$

INTEGRATED DENSE FLUID OXIDATION CLEANING, DRYING AND PROCESS FLUIDS MANAGEMENT SYSTEM

OVERVIEW OF MAJOR MODULES

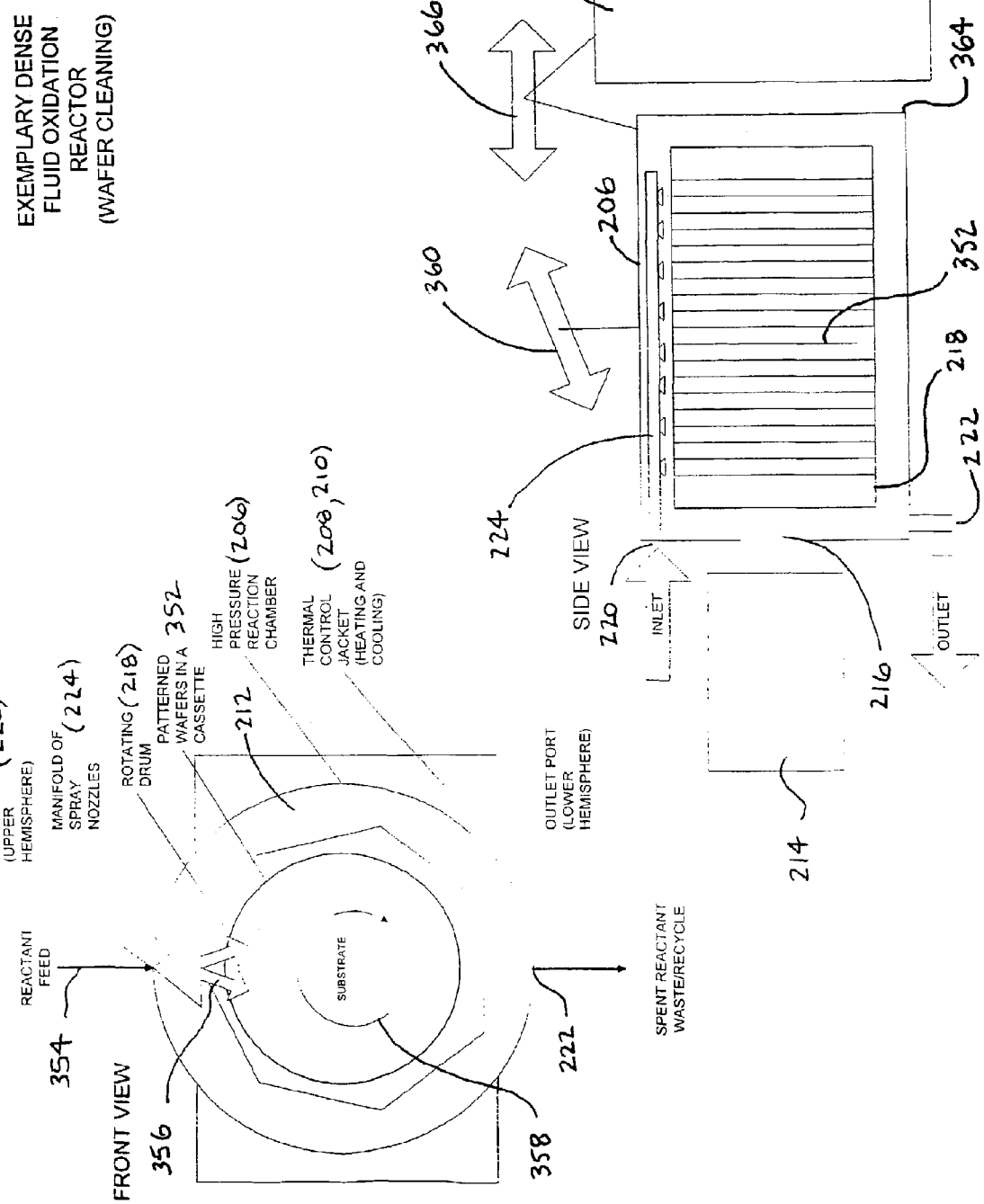

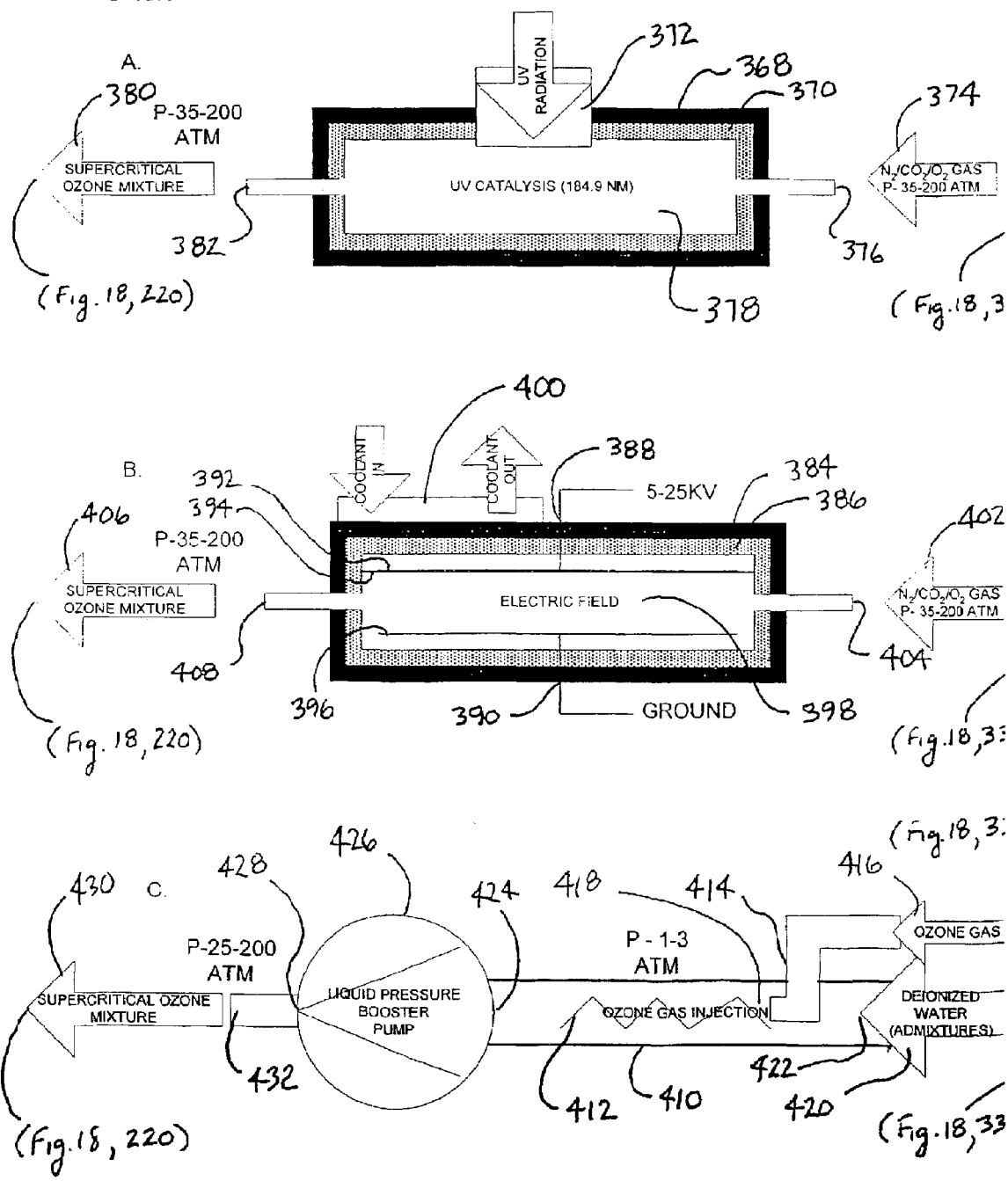

EXEMPLARY PROCESS
FLOWCHART

EXEMPLARY PROCESS
DYNAMICS

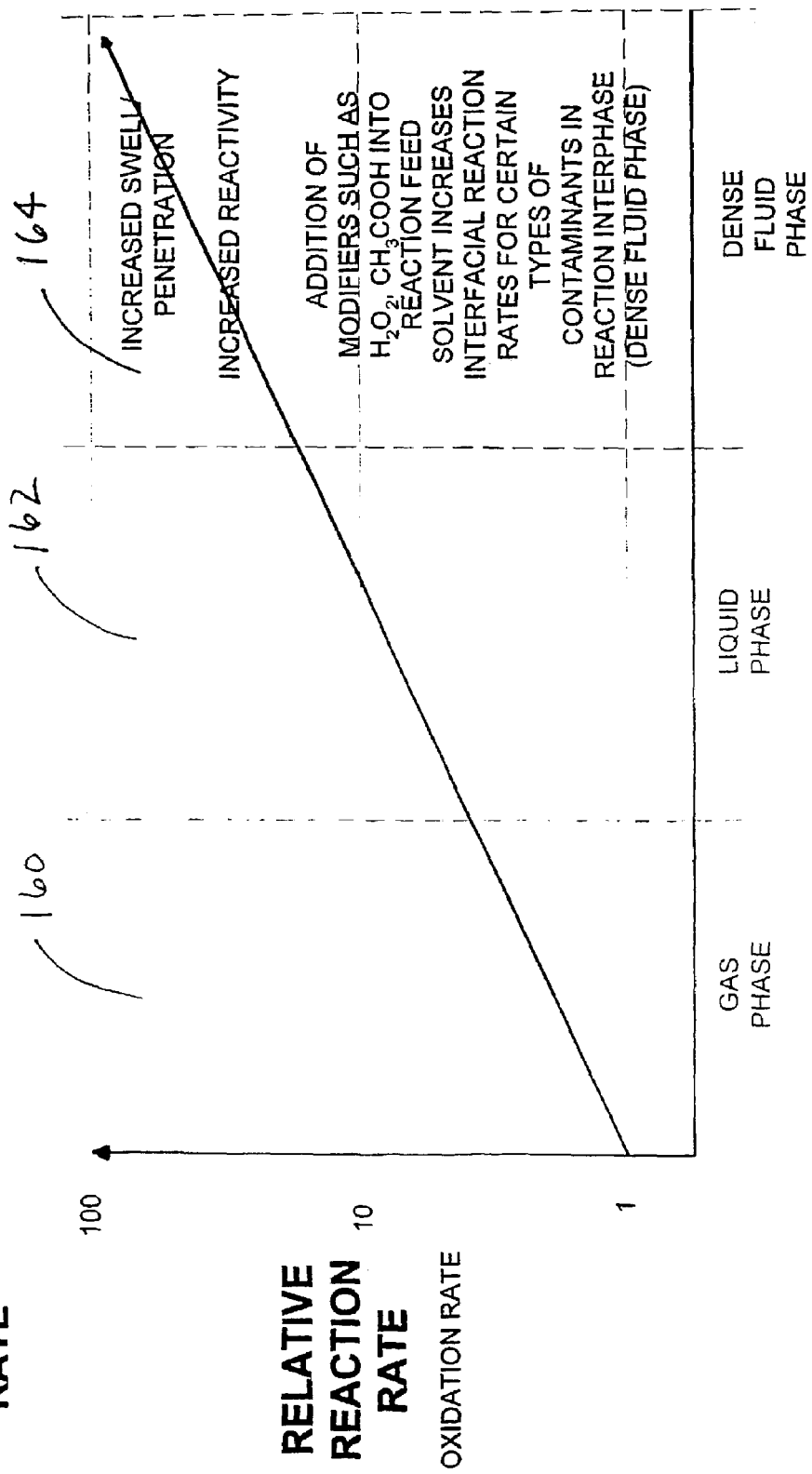

METHOD AND APPARATUS FOR SUPERCRITICAL OZONE TREATMENT OF A SUBSTRATE

BACKGROUND OF INVENTION

1. Field of the Invention

The present invention relates to the chemical arts. More particularly the invention relates to a method for cleaning, rinsing and/or drying substrates with a dense fluid.

2. Discussion of the Related Art

The manufacture of patterned photoresist wafer using lithographic techniques, such as ion implanting organic photoresist techniques, results in a product contaminated with photoresist residues, such as organic films and particles. The presence of particles on the wafer's surface is undesirable because it often results in lower die yields on the semiconductor wafer.

This has resulted in a great need for the development of methods for photoresist stripping, including the steps of cleaning, rinsing and/or drying contaminated patterned photoresist wafers that avoid the use of hazardous chemicals, such as organic solvents, acids, hydrogen peroxide, and amine-based cleaning agents. The efforts have been made more difficult by recent technological advances in the area of manufacturing patterned photoresist wafers, such as Microelectromechanical Systems (MEMS). The shrinking of line widths and production of trenches with high aspect ratios exasperate the problem of developing acceptable cleaning technologies.

Resist layers may be heavily doped with ions following ion implantation or may be hardened through multiple exposures to cross-linking radiation. The challenge presented in removing these layers is that the resist materials are very resistant to attack by most chemicals and the vias in the wafer create the added problems of being very narrow and deep (high aspect ratio)—creating very high capillary pressure. High capillary pressure hinders penetration by cleaning agents, and once filled, prevents them from being removed.

Ozone is a naturally occurring triatomic form of oxygen, which, under atmospheric temperature and pressure, is an unstable gas that decomposes readily into molecular oxygen. With an electrochemical oxidation potential of 2.07, ozone is a powerful oxidant and is used commercially in precision cleaning systems in combination with deionized water. Ozone is an attractive cleaning chemical because it can be generated in-situ and following use, decomposes back into oxygen gas.

With respect to cleaning wafers to remove photoresist contamination, commercial cleaning systems have been developed which employ ozone and water to replace the dangerous or ecologically unsafe chemical processes. One such system, the SMS D103 photoresist strip process (Legacy Systems Inc., Fremont, Calif.), uses an ozone generator and diffuser located in a tank of chilled (5° C.) deionized water, which is circulated into a tank containing the wafers. However, this system suffers from an inability to apply thermal energy to the substrate, because raising the temperature lowers the solubility of ozone in solution. Furthermore, the solid ozone gas interfacial reaction is essentially time-dependent and concentration-dependent.

Another the system, the HydrOzone process, diffuses ozone gas through a thin film of heated water spread over a spinning wafer. However, similar to the SMS D103 process, transport of ozone gas of any significant concentration into micron features on the wafer surface is very limited due to the solid-ozone gas interface. Further, excessive agitation caused by rapid movement of water over the spinning wafer accelerates the decomposition of the ozone gas as it diffuses through the thin film boundary. An additional drawback of both methods is that complete drying of the substrate following cleaning is limited due to hydration of small capillaries, vias, and interstices present on the wafer. Finally, a lack of solvent selectivity can be limiting in many photoresist removal applications.

Commercial cleaning of textiles using ozonated water is also known. Ozone acting as a cleaning agent additive is used to destroy soils contained on fabrics. This method is similar to ozonated water treatment of wafer and suffers from the same solubility and selectivity problems.

Following these ozone-cleaning processes, a method often used to rinse wafers is the "quick dump" method. The quick dump method relies upon the rapid deployment of water from the rinse tank to remove water and impurities from the semiconductor wafer. A limitation with this method is its inability to remove all the contaminate particles from the wafer. In fact, the rapid deployment of water from the tank often transfers more particles onto the wafer. In addition, the wafers from the quick dump tank must still undergo a drying operation, which can further increase the number of particles on the wafer.

Another technique used to both rinse and dry wafers relies upon a spin rinse/dryer. The spin rinse/dryer uses a combination of rinse water spray to rinse the wafers and centrifugal force to remove the water. The drying step removes water from the semiconductor wafer substantially by centrifugal force and evaporation. However, the spin rinse/dryer also can introduce more particles onto the wafer. Initially dissolved or suspended contaminants, such as particles in the water are often left on the semiconductor wafer, thereby reducing the number of good dies on the wafer. Additionally, static electricity often builds up on the wafers during the spin cycle, thereby attracting even more particles onto the surface of the semiconductor. Another limitation with the spin rinse/dryer is its complex mechanical design with moving parts and the like. The complex mechanical design often leads to problems such as greater downtime, wafer breakage, more spare parts, and greater costs, among others.

Other techniques used to dry wafers include an isopropyl alcohol (IPA) vapor dryer and a full displacement IPA dryer. An example of such a technique is described in U.S. Pat. No. 4,911,761, in the name of McConnell et al. McConnell et al. generally describes the use of a superheated or saturated drying vapor as a drying fluid. The superheated or saturated drying vapor forms a thick organic vapor layer overlying the rinse water to displace (e.g., plug flow) such rinse water with the drying vapor. The thick vapor layer forms an azeotropic mixture with water, which will condense on wafer surfaces, and will then evaporate to dry the wafer. A drawback of these dryers is their use of the large solvent quantity, which is hot, highly flammable, and hazardous to health and the environment. Another limitation with such these dryers is their cost.

Still another drying technique relies upon hot process water to rinse and promote drying of the semiconductor wafer. However, hot water often produces stains on the wafer, and also promotes build-up of bacterial and other particles.

As line size becomes smaller and the complexity of semiconductor integrated circuits increases, there is a definite need for an improved wet processing method and an apparatus for practicing the method that removes unwanted organic films and particles from wafers, prevents additional particles from being deposited on the wafer, and does not introduce stains on the wafers. There is a further definite need for an improved process for then drying the wafers.

BRIEF SUMMARY OF THE INVENTION

Now there has been found an improved method and apparatus that provides a safe, efficient, and highly selective process for cleaning, rinsing and/or drying a substrate (or other object) such as a semiconductor wafer. The invention is especially useful in removing patterned photoresist residue from a wafer, removing residual small particles, and precision drying semiconductor wafers that have undergone various lithographic processes.

In accordance with the inventive method, the substrate is treated with a reaction solvent formed of supercritical ozone in a feed phase. The feed phase can be aqueous, e.g., formed of heated, deionized water, nonaqueous, e.g., formed of a dense fluid, such as supercritical carbon dioxide, liquid carbon dioxide, supercritical nitrogen or combinations thereof or the feed phase can be a mixture of aqueous and nonaqueous phases.

In some embodiments, the reaction solvent additionally contains a reaction modifier, including oxidation catalysts and phase transfer catalysts. Representative reaction modifiers include hydrogen peroxide, acetic acid, or combinations thereof.

In embodiments where the process is carried out in an aqueous phase, the apparatus includes a high pressure reactor for holding the substrate to be treated, a fluid inlet into the reactor, and a fluid outlet out of the reactor. In some embodiments, an internal spray head is connected to the fluid inlet, while in some embodiments, a reactor heater and a reactor cooler are operatively connected to the reactor. The apparatus includes a feed source for supercritical or near critical oxygen, a feed source for heated water, and a mixer. An oxygen source outlet line connects the oxygen feed source to the mixer, a deionized water source outlet line connects the water source to the mixer, and a mixer outlet line connects the mixer to the fluid inlet.

In some embodiments, the apparatus includes a rotable fixture for holding the substrate. And in some embodiments, a magnetic drive shaft is included to rotate the fixture. Some embodiments additionally include an ozone generator disposed in the oxygen outlet line.

In those embodiments where the process is carried out in a combination of aqueous and nonaqueous phases, the apparatus further includes a feed source for an additional dense fluid including supercritical, near critical or liquid carbon dioxide and/or a feed source for supercritical or near critical nitrogen. In these embodiments, the outlet lines can either be connected to the fluid source or they can be connected to the oxygen source outlet line at a location between the oxygen source and the ozone generator. In those embodiments where the process is carried out in a nonaqueous phase, the apparatus includes, the feed source(s) for an additional dense fluid, but does not include a feed source for deionized water.

A further understanding of the nature and advantages of the invention may be realized by reference to the latter portions of the specification and attached drawings.

BRIEF DESCRIPTION OF THE DRAWINGS

FIG. 13A is a flow diagram illustrating a device for the UV catalyzed generation of supercritical ozone and mixtures.

FIG. 13B is a flow diagram illustrating a corona discharge for generating supercritical ozone and mixtures.

FIG. 13C is a flow diagram illustrating an alternative device for generating supercritical ozone and mixtures.

FIG. 19 illustrates an exemplary dense fluid oxidation reaction according to the present invention.

FIG. 20 illustrates an exemplary dense fluid ozonator according to the present invention.

FIG. 22 is a graphical presentation of the oxidation rate versus the reaction interphase according to the present invention.

DETAILED DESCRIPTION OF THE PREFERRED EMBODIMENTS

Figure 1:
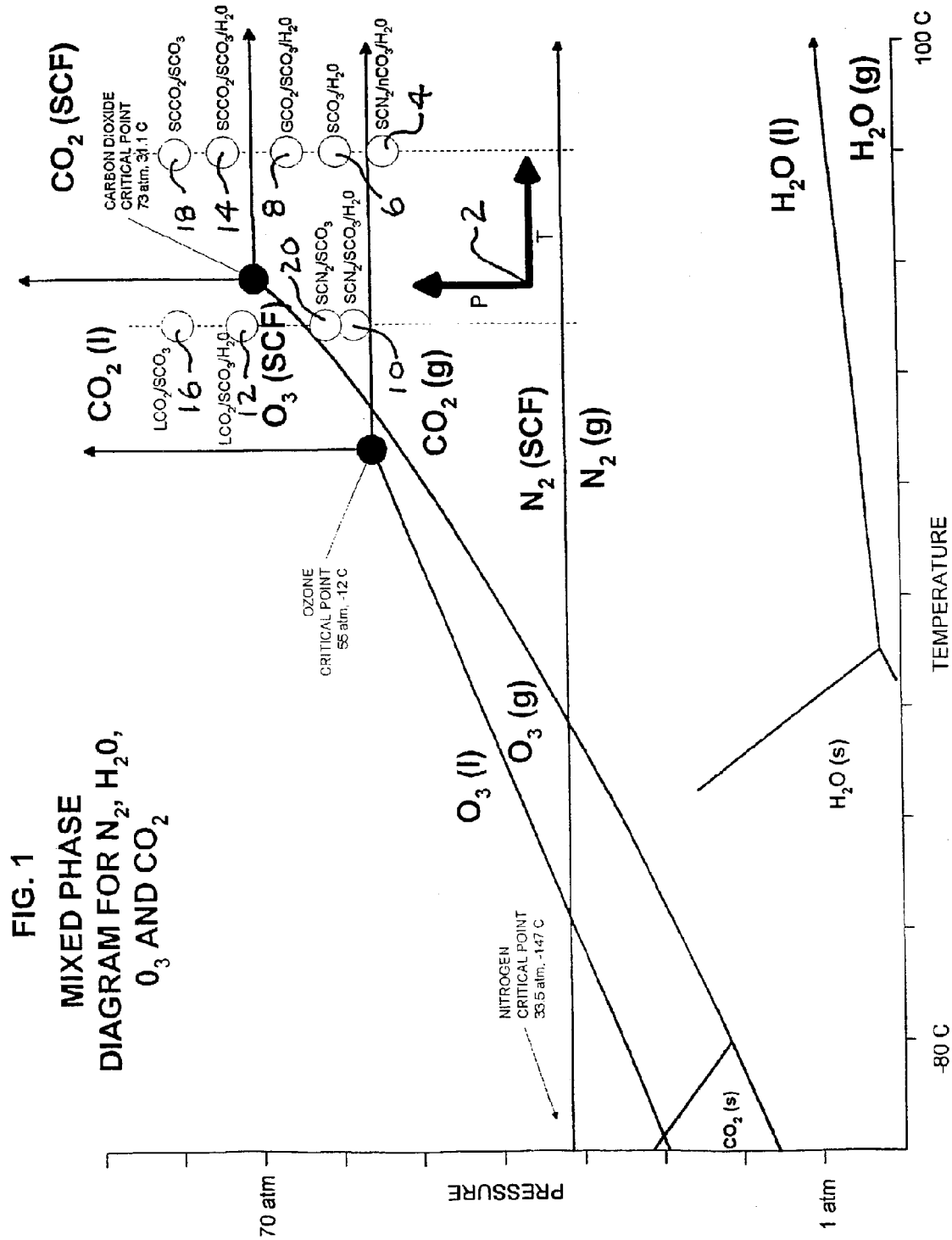
FIG. 1 is a mixed phase diagram showing near-critical and supercritical boundary conditions for $N_2$, $H_2O_1$, $O_3$ and $CO_2$.

The present invention provides a safe, efficient, and highly selective method and apparatus to clean, rinse and/or dry a substrate (or other object). In particular, the present method provides a dense fluid oxidation process that removes thick layers of organic film from the substrate and also effectively cleans the underlying substrate.

The invention is especially useful in removing patterned photoresist from a wafer, removing residual small particles, and precision drying semiconductor wafers that have undergone various lithographic processes. The method includes placing a contaminated wafer in a high pressure reactor vessel and treating the wafer with a reaction solvent, formed of supercritical or near supercritical ozone, with a feed phase, such as deionized water. In some embodiments the reaction solvent contains at least one additional dense fluid, such as, supercritical or near supercritical carbon dioxide, liquefied carbon dioxide, and supercritical or near supercritical nitrogen. The three phases present when the contaminated wafer substrate is treated with the reaction solvent include a substrate-contaminant phase, a reaction interphase, and a reaction feed solvent phase. The three phases form two interfacial boundaries, a substrate-contaminant phase/reaction interphase boundary and a reaction interphase/reaction feed solvent phase boundary.

The term dense fluid is used herein to describe physical states of ozone, carbon dioxide, and nitrogen wherein these normally gaseous substances have densities that are within the range of liquid or near-liquid substances. Supercritical or near supercritical ozone, supercritical or near supercritical carbon dioxide, and supercritical or near supercritical nitrogen can be compressed to a range of liquid-like densities, yet they retain the diffusivity of a gas. Continued compression of these supercritical or near supercritical fluids causes continued increase in density, approaching that of their corresponding liquid phases.

For example, ozone exists as a gas at atmospheric temperature and pressure. Ozone can be compressed to near or above its critical point through pressure and temperature adjustment. The critical pressure and temperature for ozone is 55 atm and −12° C., respectively.

Similarly, carbon dioxide exists as a low-density gas at standard temperature and pressure conditions and possesses phase boundaries with a triple point (solid-liquid-gas coexist in equilibrium like a glass of ice cubes and water) and a critical point (liquid-gas have identical molar volumes). Through pressure or temperature modification, carbon dioxide can be compressed into a dense gas state. Compressing carbon dioxide at a temperature below its critical temperature liquefies the gas at approximately 70 atm. Cooling liquid-state or gas-state carbon dioxide to its freezing point causes a phase transition into solid-state carbon dioxide. Compressing carbon dioxide at or above its critical temperature and critical pressure also increases its density to a liquid-like state, however there is a significant difference between compression below and above the critical point. Compressing carbon dioxide above its critical point does not effect a phase change. In fact, carbon dioxide at a temperature at or above 305° K cannot be liquefied at any pressure, yet the density for the gas may be liquid-like. At the critical point the density is approximately 0.47 g/ml. At or above this point carbon dioxide is termed a supercritical fluid.

In contrast with both ozone and carbon dioxide and ozone, nitrogen can be compressed to near or above its critical point using only pressure adjustment since its critical properties are 33.5 atm and −147 C. Combining various dense fluids such as carbon dioxide, nitrogen, along with ozone in various compositions provides unique stratification and interphase behavior which is very different from conventional standard temperature-pressure solvent mixtures.

FIG. 1 is a mixed phase diagram showing near-critical and supercritical boundary conditions for nitrogen, water, ozone and carbon dioxide. By adjusting the pressure and temperature 2 of various mixtures of carbon dioxide, nitrogen, ozone and water, various mixed-phase aqueous and non-aqueous combinations can be produced. For example, aqueous mixed-phase compositions can be created, including supercritical nitrogen-near critical ozone-water 4, supercritical ozone-water 6, near-critical carbon dioxide-supercritical ozone-water 8, supercritical nitrogen-supercritical ozone-water 10, liquid carbon dioxide-supercritical ozone-water 12, and supercritical carbon dioxide-supercritical ozone-water 14. Non-aqueous mixed-phase compositions may be created including liquid carbon dioxide-supercritical ozone 16, supercritical carbon dioxide-supercritical ozone 18 and supercritical nitrogen-supercritical ozone 20. Each of these phase combinations provides unique reaction environment conditions of pressure, temperature, cohesion energy, surface tension, viscosity and interphase transport conditions.

Table 1 gives some physicochemical data for various dense fluids and water. The dense fluids exhibit variable density and cohesion energy (solubility chemistry)—a phenomenon called spectrum solvency or variable geometry. Additionally, the dense fluids exhibit no surface tension—providing instantaneous wetting of and rapid penetration into substrate surfaces. By comparison, water exhibits relatively constant viscosity, density, surface tension and cohesion energy, with the exception of gas-saturated water. Water, in comparison to dense fluids, exhibits a dramatic difference in these properties.

TABLE 1

| REACTION FLUID | DENSITY (g/cm$^3$) | VISCOSITY mN-s/M$^2$ | SURFACE TENSION (DYNES/CM) | COHESION PARAMETER (MPa$^{1/2}$) |
|---|---|---|---|---|
| SUPERCRITICAL OZONE | 0.44 | 0.03 | 0 | 8–12 |
| SUPERCRITICAL NITROGEN | 0.33 | 0.02 | 0 | N.S. |
| SUPERCRITICAL CARBON DIOXIDE | 0.47 | 0.03 | 0 | 12–22 |
| LIQUID CARBON DIOXIDE | 0.9 | 0.07 | 5 | 20–22 |
| GASEOUS CARBON DIOXIDE | 0.003 | <0.01 | <1 | N.S. |
| WATER | 1.0 | 0.89 | 72 | 47.9 |

Densities for Dense Fluids Given at C.P.
Viscosities of O3/N2 Estimated based on similar Dense Fluids
(No Data Available)
N.S.—No/Minimal Solvency The substrate-contaminant phase is typically solid/semi-solid in nature. It is formed by the substrate having an unwanted substance(s) (i.e., ion implanted organic photoresist) contained on its surface.

The reaction interphase is a substantially nonaqueous dense fluid medium within which reactants, and in some embodiments, reaction modifiers, such as carbonates, oxidation catalysts, and phase transfer catalysts flow into, and reaction by-products (reacted contaminants) flow out of. Reaction modifiers are used to accelerate or retard the dense fluid oxidation reaction. The reaction interphase is a boundary film, of variable thickness depending upon the reaction rate (reactivity and selectivity) desired, within which the unwanted contaminant contained on the surface of the substrate is selectively contacted and reacted to produce a separation between the wafer and the contaminant through supercritical oxidative degradation, as well as permeation, shear, and solubilization.

The reaction feed solvent phase is a bulk solvent phase, typically present in much greater volume than the other phases. The reaction feed solvent phase delivers a mixture of reactants, and in some embodiments, reaction modifiers. In one embodiment of the inventive method the reaction feed solvent phase is an interacting solvent phase—that is it is generally heterogeneous with the reaction interphase. In an alternative embodiment, the reaction feed solvent phase is a non-interacting solvent phase. Reactants contained within the reaction feed solvent phase are selectively concentrated within the reaction interphase through adjustment of reactant feed concentrations, pressure and temperature. Moreover, the substrate may be selectively contacted within the reactor vessel to be in both the aqueous phase mixture and the non-aqueous phase mixture (semi-aqueous processes).

The difference in physicochemical properties is exploited to create the reaction interphase and the reaction feed solvent phase. These interphases favor reactants and reaction by-products differently. Additionally, the differences in viscosities between dense fluids and water provide different substrate surface interlayer shearing and reactant interlayer transport—both higher in the reaction interphase. Exploiting the differences between various dense fluids and water provides a variable geometry reaction environment—wherein selectivity for a particular contaminant on a substrate and transport of reacted contaminant away from the substrate may be optimized.

Moreover, interphase differences between the reaction interphase and the reaction feed solvent phase are used in the present invention to provide improved drying (dewetting) of a substrate following aqueous processes and improved small surface particle removal. The reaction interphase (containing the dense fluid) promotes separation of the reaction feed solvent (containing the water) from the substrate as the reaction mixture is drained away from the substrate.

Figure 2:
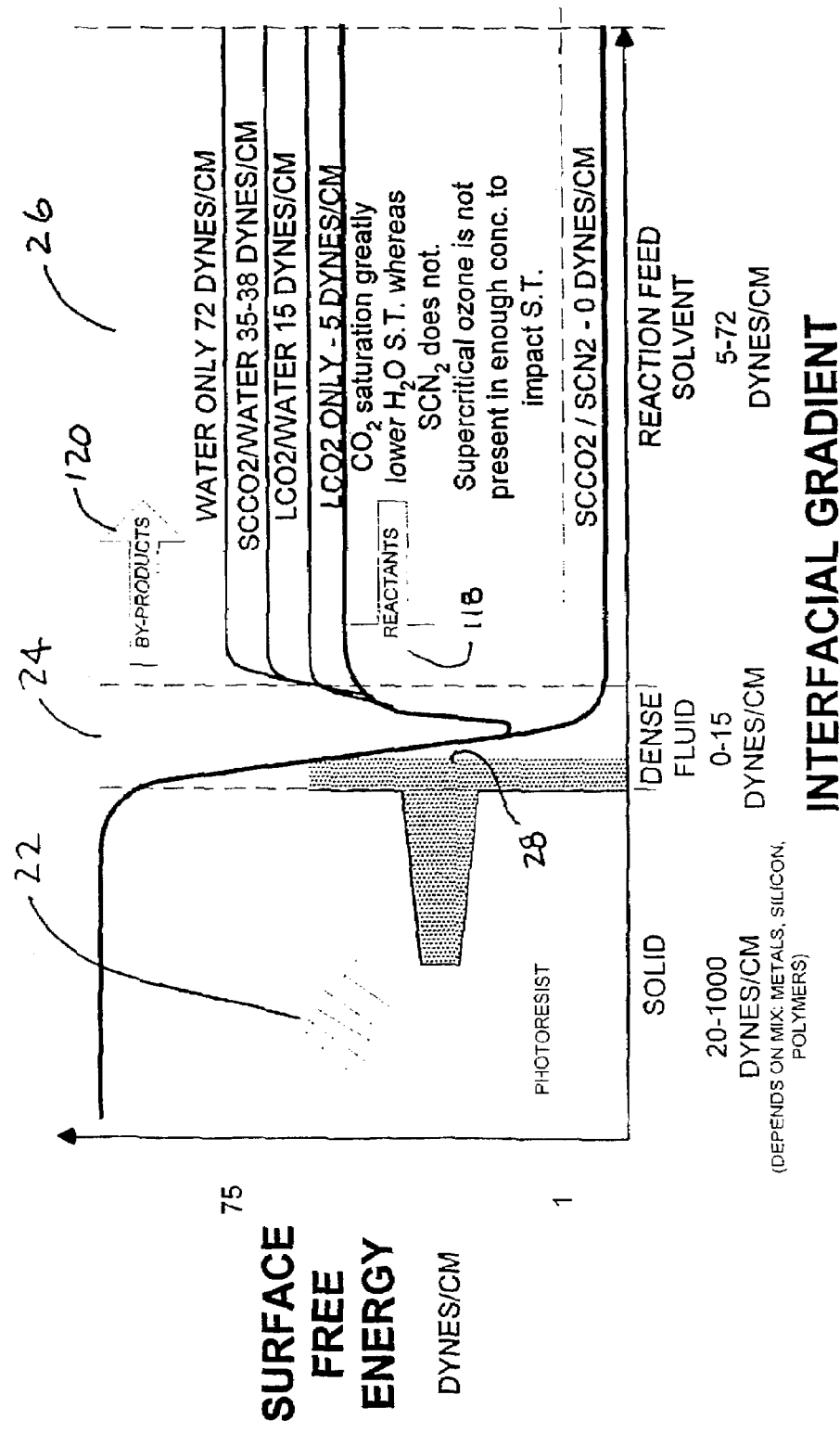
FIG. 2 is a diagram of the surface free energy of the various phases of the present invention for different reaction solvents.

FIG. 2 describes the surface free energies for the three phases. Surface free energy or surface tension (S.T.) for reaction interphase fluids 24 are much lower than conventional ozonated processes using water. The presence of low surface free energy between the substrate-contaminant phase 22 and reaction feed solvent phase 26 provides an environment for rapid wetting (cleaning) or dewetting (drying) of the substrate. It is a feature of the invention that the interfacial free energy can be altered to favor concentration of low surface tension reactants such as supercritical ozone—which favors high reactivity and reaction rates in contact with the contaminant 28. In contrast, higher surface free energy within the reaction feed solvent phase 26 favor concentration of by-products. The reaction interphase favors reactants 118, such as supercritical ozone, while the reaction feed solvent favors by-products 120 of the dense fluid ozonation process. Using various reaction solvents, a spectrum of surface free energies can be produced for a given cleaning application.

Figure 3:
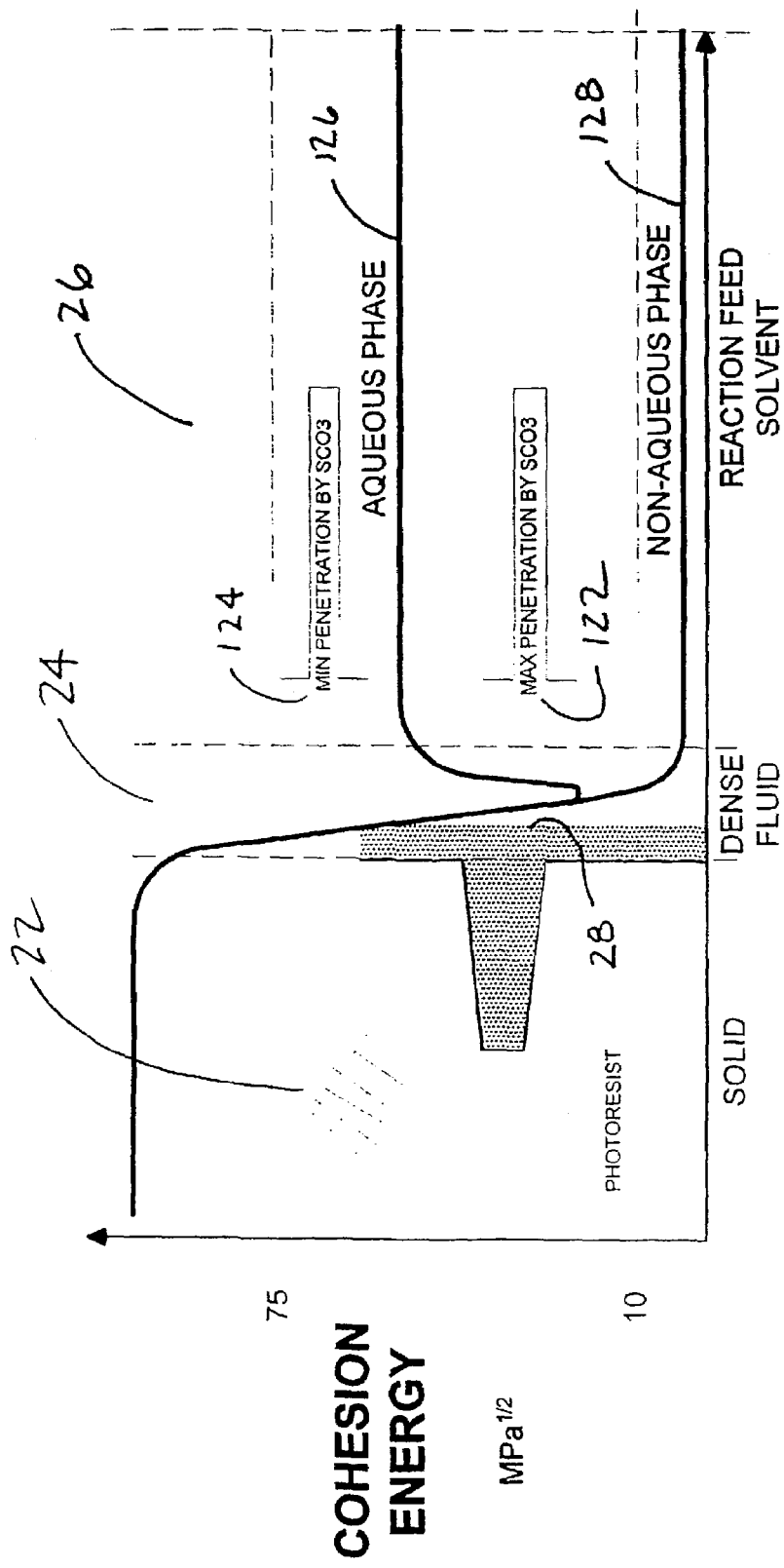
FIG. 3 is a diagram of the cohesion energy values for various phases of the present invention in relation to penetration and swell of organic contaminants.

FIG. 3 describes the cohesion energy values for the three phases in relation to penetration and swell of organic contaminants on the substrates. As shown in the figure, matching cohesion energy content of the reaction interphase 24 to be close to the contaminant 28 permits the reactants to penetrate and swell the contaminant 28. Swelling enhances the permeation of supercritical ozone 122 into the subsurface of the contaminant 28. By contrast, large differences between the reaction interphase fluids 24 and the contaminant 28 decrease penetration of supercritical ozone 124 into the subsurface of the contaminant 28. It is a feature of the inventive method, that the rate at which dense fluid ozonation reactions proceed at the reaction interphase 24 can be controlled. For example, an aqueous reaction feed solvent phase 126 has much higher cohesion energy than the reaction interphase 24. By contrast, a non-aqueous reaction feed solvent phase 128 has much lower cohesion energy as compared to the solid phase 28. Therefore, the choice of aqueous/semi-aqueous reaction feed solvents versus non-aqueous reaction feed solvents can be used to control the rate of reaction.

Figure 4:
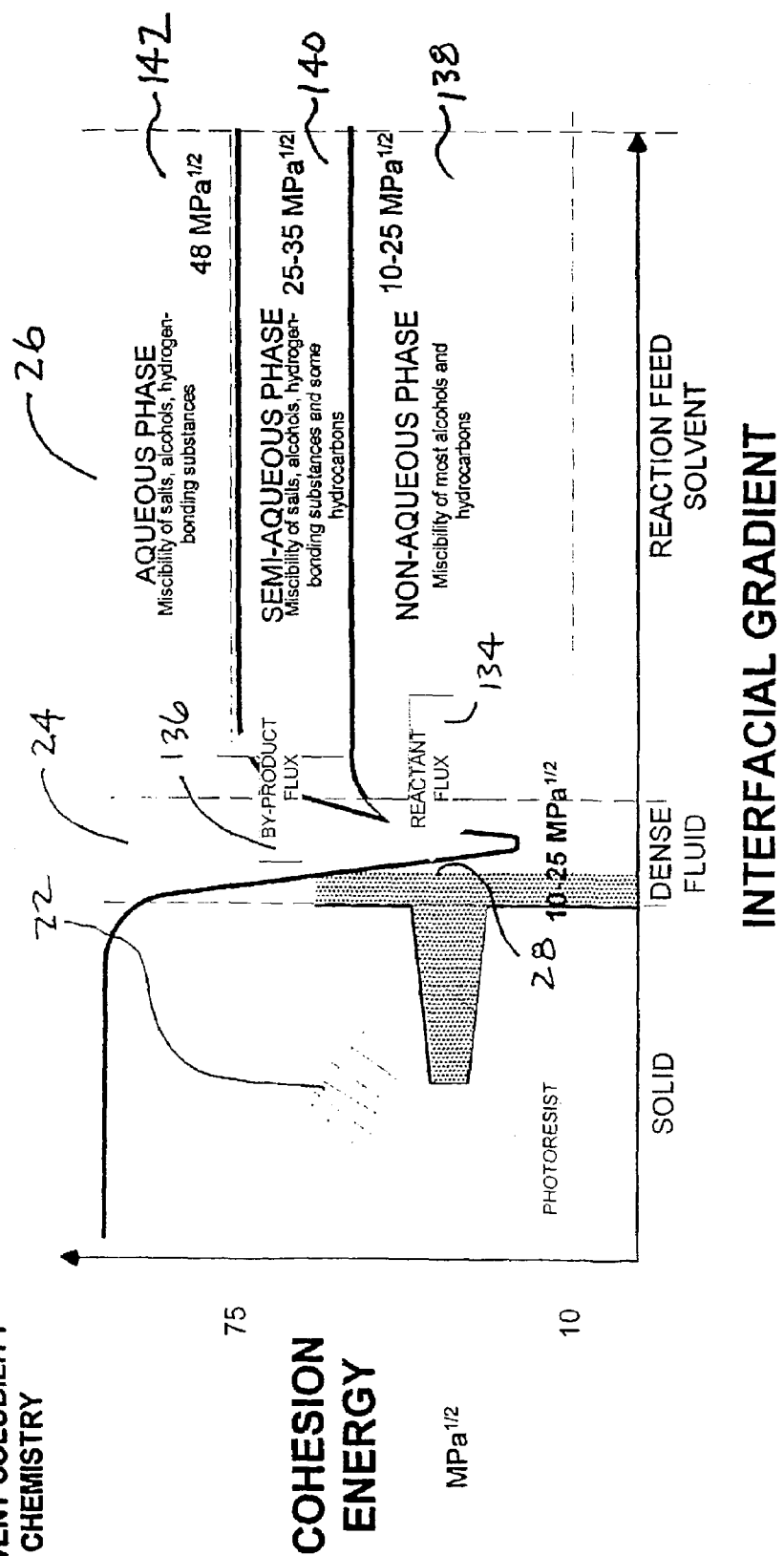
FIG. 4 is a diagram illustrating reaction interphase and reaction feed solvent phase behavior in relation to cohesion energy.

FIG. 4 describes reaction interphase and reaction feed solvent behavior in relation to cohesion energy. It is a feature of the inventive method that the cohesion energy of the phases can be altered to provide optimum conditions for increasing reactant flux 134 into the reaction interphase 24 and increasing by-product flux 136 into the reaction feed solvent phase 26. Under this condition, the reactants concentrate at the substrate-contaminant phase/reaction interphase boundary and react with the organic contaminant 28. Altering the reaction feed solvent 26 cohesion energy provides regulation of the reaction interphase 24 reactions. Non-aqueous reaction feed solvents 138 solubilize some alcohols and most hydrocarbons. Semi-aqueous reaction feed solvents 140 solubilize most alcohols, some salts and some hydrocarbons. Aqueous reaction feed solvents 142 solubilize most alcohols and most salts. As such, reaction interphase 24 can be engineered to be more or less miscible with reactants and by-products, which controls reaction rates. Likewise, reaction feed solvents 26 can be selected on the basis of being more or less miscible with reactants and by-products. Optimum cohesion energy values for reaction mixtures using the present invention fall within the semi-aqueous range 140—having miscibility with most of the by-products, such as salts and water, yet having limited solubility for the dense fluid reactants.

Figure 5:
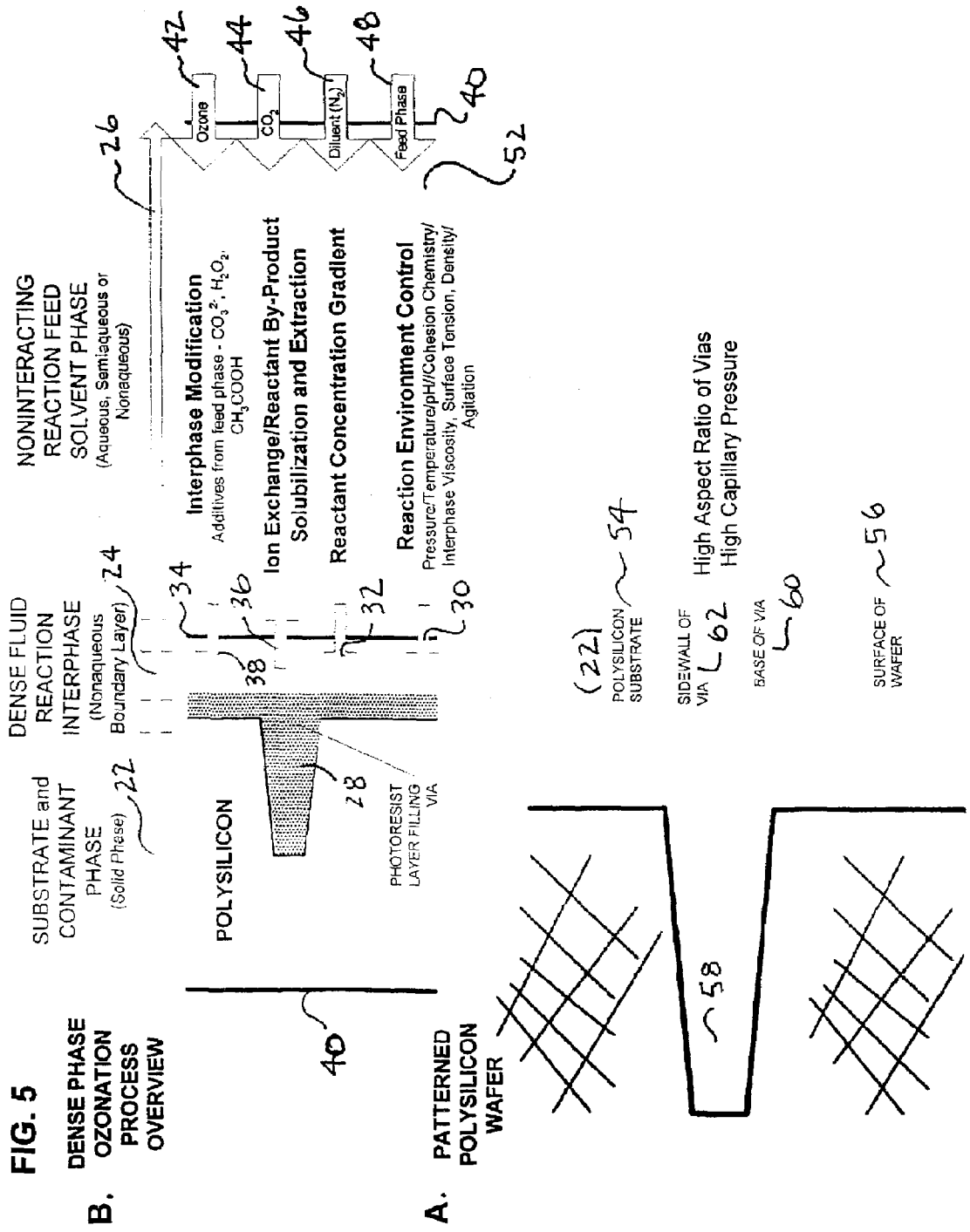
FIG. 5A is a diagram illustrating a substrate-contaminant phase.
FIG. 5B is a flow diagram illustrating the process in accordance with the invention.

The overall cleaning process involves the oxidation of organic and inorganic contaminants present on a substrate into carbon dioxide, water, and other benign compounds. Dissolved salts and metals released during cleaning are typically precipitated as solids and filtered from the dense fluids. FIG. 5A shows components of the substrate-contaminant phase 22. The substrate comprises a polysilicon semiconductor wafer 54 having a front patterned surface 56 and a back unpatterned surface (not shown). The pattern comprise various topographical features including a microscopic via 58 or trench containing various interlayers of silicon, metals, and other chemical compounds at the base of the via 60 and on the sidewalls of the via 62. Contained within the via 58 and on the surface of the wafer 56 a photoresist layer 28 consisting trace residues of wax, a positive resist, and a negative resist. It is an advantage of the inventive process that it effectively removes of the resist from the wafer without damaging critical wafer surface and via sidewall interlayers.

FIG. 5B is a flow diagram of the inventive process. The entire process is performed in a high-pressure reactor vessel (not shown), which is bounded by stainless steel barriers 40. Ozone 42, carbon dioxide 44, nitrogen 46 and a deionized water feed phase are mixed from outside the high-pressure reaction vessel or within a high-pressure barrier (not shown) containing the contaminated substrate 22.

Illustrated in FIG. 5B are the three phases, the substrate-contaminant phase 22, the reaction interphase 24, and the reaction feed solvent phase 26. Also shown are the two interfacial boundaries, the substrate-contaminant phase/reaction interphase boundary and a reaction interphase/reaction feed solvent phase boundary.

Treating substrates with supercritical ozone alone with other dense fluids under near-critical or supercritical conditions, and specifically in mixed phase treatments under the present invention, affords opportunities to manipulate the reaction environment (interphase solvent properties) by manipulating pressure, temperature, and phases present, to enhance solubility of reactants and products, to eliminate interphase transport limitations on reaction rates and to integrate reaction, separation, rinsing aid drying operations. Moreover, near critical and supercritical ozone treatments of the present invention affords much improved selectivity by altering the physicochemistry of interphase constituents intimate with the substrate surface.

The reaction feed solvent phase 26 is controlled using pressure, temperature, and chemical modification to exhibit selectivity and reactivity for a particular contaminant 28, for example, polymethylmethacrylate (PMM), contained on the substrate 22.

Through the control of pressure, temperature, agitation, and phase mixture chemistry, the reaction interphase 30 is controlled to exhibit variable geometry, including cohesion chemistry, viscosity, surface tension, pH, density, and fluid shear. This creates a reactant concentration gradient 32 across the reaction interphase/reaction feed solvent phase boundary 34. The reaction modifiers, such as carbonates, peroxides, and acetic acid, present in the reaction feed solvent phase 26 are selectivity solubilized or transported 38 into the reaction interphase 24. Reaction by-products, such as carbon dioxide, water solubilized partial degradation products, and salts are extracted 36 from the reaction interphase 24 into the reaction feed solvent phase 26.

The primary reactant of the present invention is supercritical ozone. The O., $HO_2$., and HO. free radicals generated during supercritical ozone decomposition are produced rapidly and serve as very potent oxidants in cleaning operations of the present invention. Ozone has an oxidation potential of −2.07V—far higher than most organic and inorganic contaminants present on substrates. Moreover, supercritical ozone is much more dense than ozone gas and the solvent power (solubility chemistry) of supercritical ozone is much greater and variable as compared to ozone in gas phase. As such, supercritical ozone has 'solvent-like' and 'gas-like' chemistry—having no surface tension but delivering concentrated oxidation chemistry directly into intimate contact with the substrate-contaminant phase.

Supercritical ozone acts by direct or indirect oxidation, by ozonation or by catalysis. The three major reaction pathways occur as follows: (1) by direct oxidation reactions of supercritical ozone, resulting from the action of an atom of oxygen, are typical first order high redox potential reactions; (2) by indirect oxidation reactions of ozone, the ozone molecule decomposes to form free radicals (OH.) which oxidize organic and inorganic compounds; and (3) by ozonolysis, that is, by fixing the complete molecule on the double linked atoms (double bonds), producing two simple molecules with differing properties and molecular characteristics.

Figure 6:
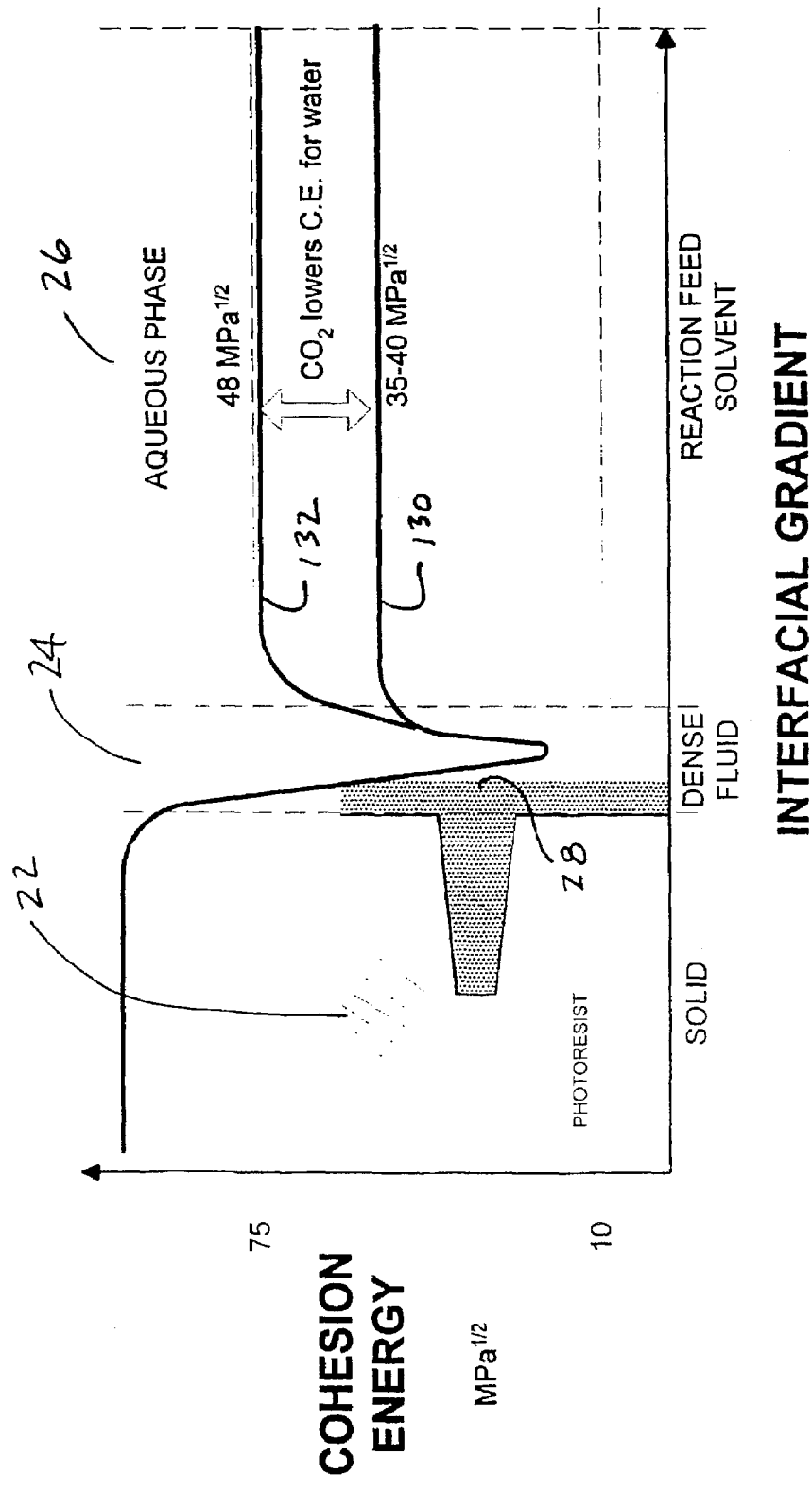
FIG. 6 is a diagram providing cohesion energy values for carbon dioxide-water mixtures and illustrating their effect upon contaminants.

FIG. 6 describes the effect upon contaminants in contact with carbon dioxide-water mixtures due to differences in cohesion energy. The figure shows that the cohesion energy for water can be dramatically altered using an interacting solvent feed phase component such as carbon dioxide. Carbon dioxide under pressure forms lewis acid-base complexes and carbonic acid. These strong interactions greatly reduce the overall cohesion energy of water 130. These same interactions are partly responsible for lowering the surface tension of water as well. By contrast, supercritical nitrogen does not appreciably lower cohesion energy of water 132. It is a feature of the inventive method that carbon dioxide and/or nitrogen can be selectively used to alter the cohesion energy of aqueous reaction feed solvent phases 26. This capability provides different cohesion energies for the reaction interphase 24, contaminant 28, and substrate 22.

In some embodiments, the deionized water also contains supercritical or liquid carbon dioxide. Table 2 gives surface tension values for water saturated with carbon dioxide at various temperatures at the critical pressure for carbon dioxide. Extrapolating known surface tension data for carbon dioxide saturated water shows that the surface tension for water is lowered significantly (from 72 dynes/cm to 15 dynes/cm). This property is exploited to modify the reaction interphase/reaction feed solvent phase boundary.

TABLE 2

| REACTION FEED FLUID ($H_2O/CO_2$) CHARACTERISTICS AT VARIOUS TEMPERATURES (C) AND 73 ATM. | SURFACE TENSION (DYNES/CM) | $CO_2$ SOLUBILITY (WEIGHT %) |
| --- | --- | --- |
| 15 | 15 | 12 |
| 30 | 28 | 9 |
| 40 | 36 | 7 |

Some embodiments of the dense phase oxidation reaction include small amounts of reaction modifiers. Suitable reaction modifiers include oxidation catalysts such as hydrogen peroxide and acetic acid, which are added to enhance supercritical ozonation reactions or to serve as phase transfer catalysts, which enhance solubility of, and reactions of supercritical ozone within, the reaction interphase.

The addition of hydrogen peroxide increases reactivity in some substrate cleaning applications. Without wishing to be bound by a theory of the invention, it is believed that this is due to the following reaction mechanism:

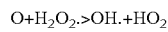

The selective solubility of hydrogen peroxide from the reaction feed solvent phase and into the reaction interphase adjacent to and in contact with the substrate-contaminant phase increases OH. free radical formation within the reaction interphase.

Figure 7:
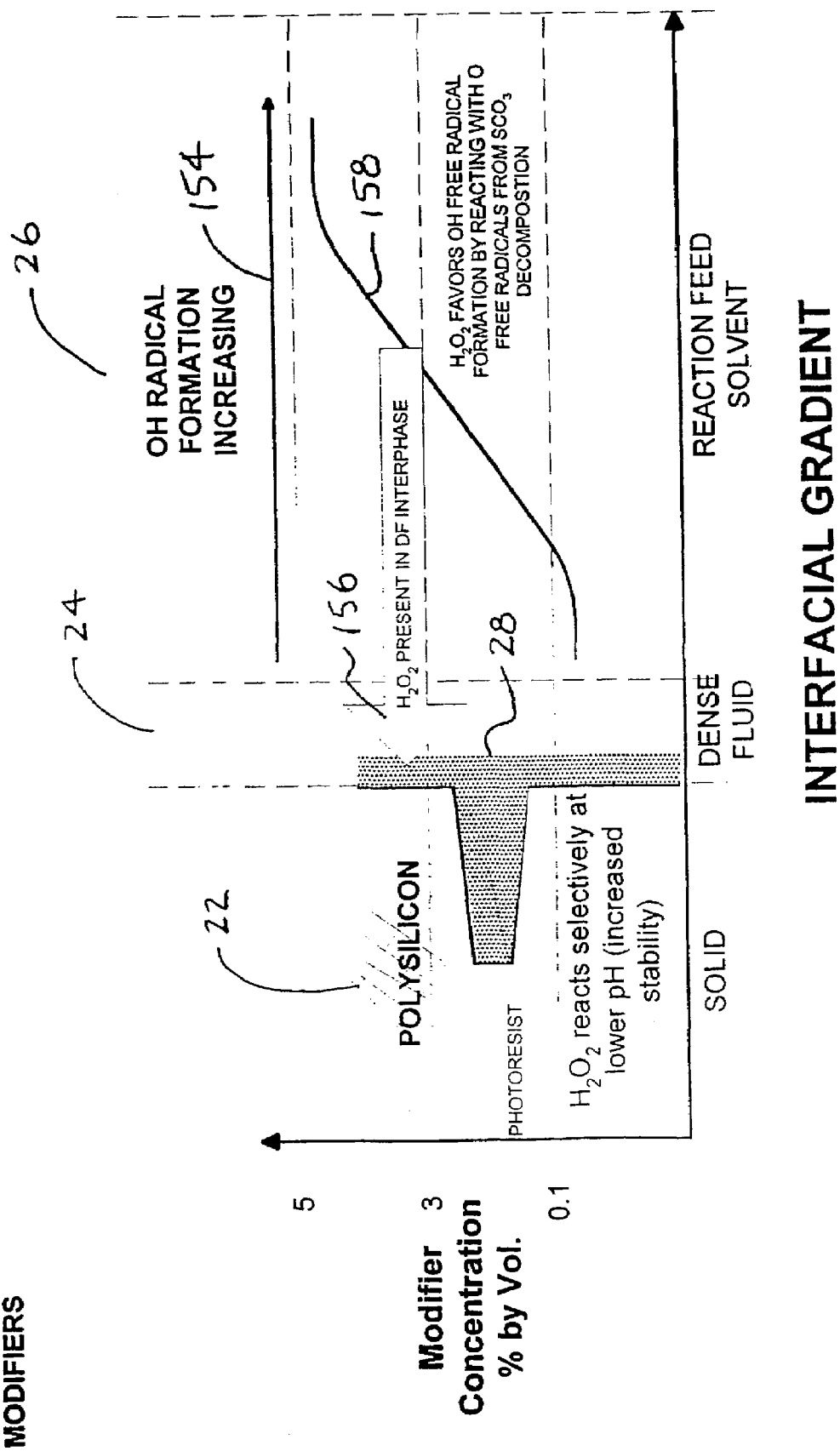
FIG. 7 is a diagram illustrating effect of reaction modifiers on the inventive process.

FIG. 7 describes the effect of hydrogen peroxide. As shown in the figure, increasing hydrogen peroxide concentration in the reaction feed solvent 26 increases hydroxyl radical formation with supercritical ozone 154. Increasing hydrogen peroxide concentration also increases its concentration 156 within the reaction interphase 24 through selective solubility within the dense fluid(s). As such, varying the hydrogen peroxide concentration 158 up to 35%, preferably in a range of from 0.1% to 5% by volume within the reaction feed solvent 26 varies the concentration of hydrogen peroxide within the reaction interphase 24 and, in turn, the concentration of hydrogen peroxide in contact with the contaminant 28. Lowering the pH further increases the selectivity of hydrogen peroxide with respect to direct oxidation of the contaminant 28.

Figure 8:
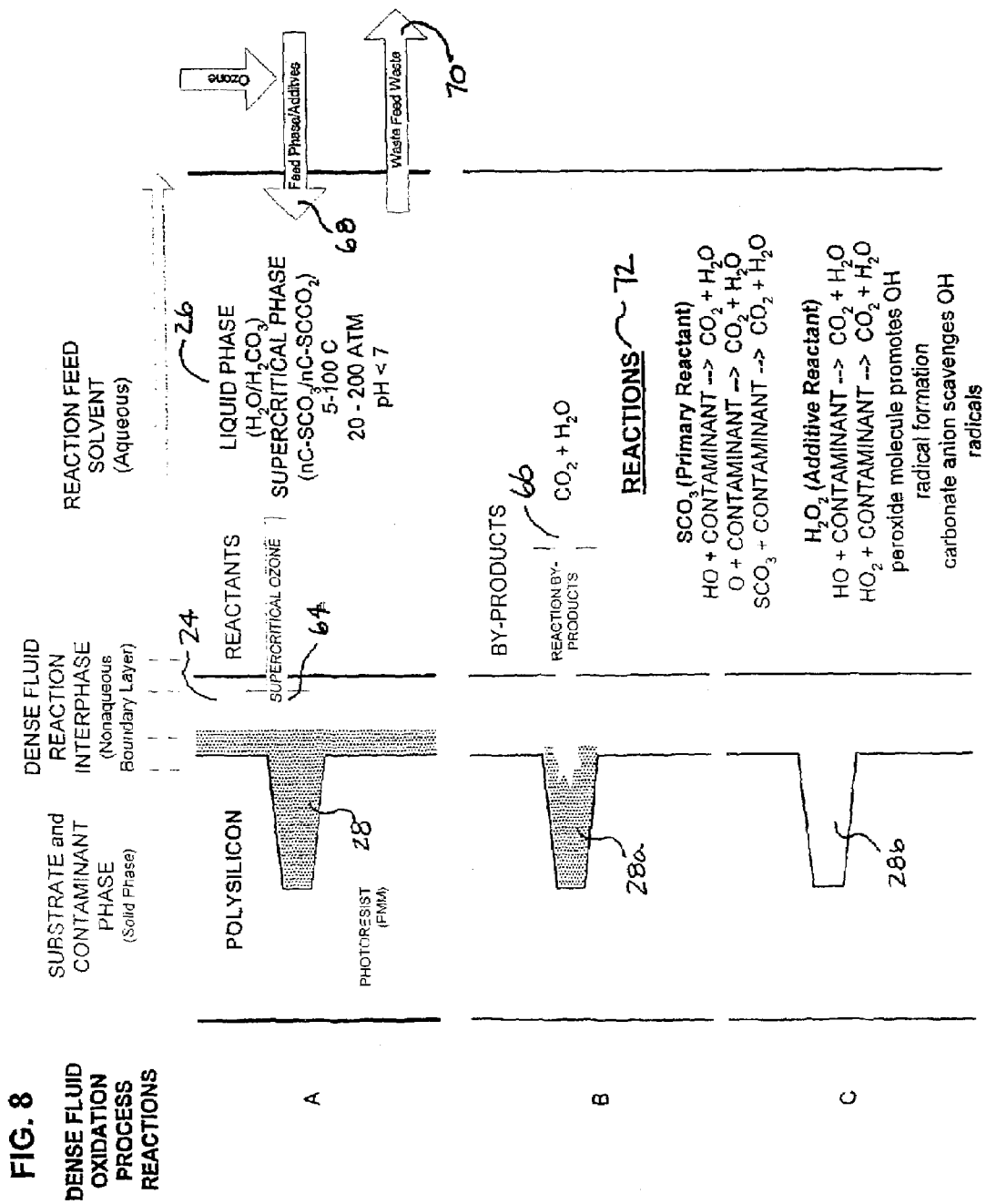
FIGS. 8A–C are flow diagrams illustrating reaction mechanisms for the inventive process.

FIGS. 8A–C illustrate reactions and reaction mechanisms for the use of supercritical ozone on a contaminated wafer. The entire process is performed in a high-pressure reactor vessel (not shown). Reactants 68 are continuously fed into the reactor during which waste feed solvent waste 70 containing reaction by-products is continuously extracted from the reactor. As shown in FIG. 8A, the reaction feed solvent phase is formed by injecting ozone into deionized water, heating to a temperature as high as 300° C., preferably in a range of between 5° C. and 100° C., and fluidizing to a pressure as high as 400 atm, preferably in a range of between 20 atm and 200 atm.

Figure 9:
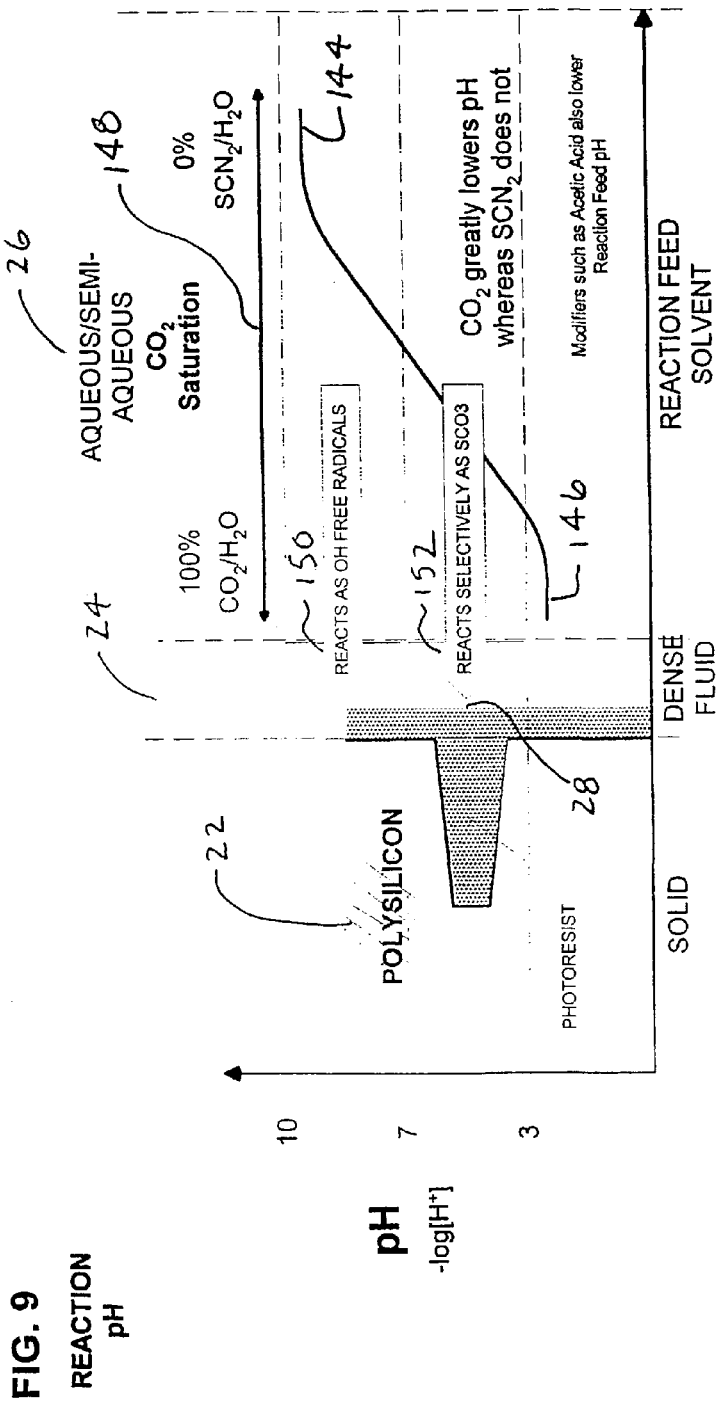
FIG. 9 is a flow diagram illustrating the effect of reaction pH on the inventive process.

FIG. 9 describes the effect of reaction pH. As shown in the figure, reaction feed solvent phase pH 26 can be controlled to be relatively neutral 144 at a pH of approximately 8 to relatively acidic 146 at a pH of 5 or lower using carbon dioxide or nitrogen as the reaction feed solvent phase component with water 148. A pH of 7 to 8 favors oxidation of the substrate-contaminant phase 22 and specifically the organic contaminant 28 through selective oxidation by hydroxyl radicals 150 within the reaction interphase 24. By contrast, lower pH values favor oxidation of the contaminant 28 through direct oxidation by the near-critical or supercritical ozone molecule 152 within the reaction interphase 24. Carbon dioxide significantly lowers and buffers the pH of the reaction interphase 24 and reaction feed solvent 26. Nitrogen does not exhibit this characteristic. Acetic acid may be added into the reaction feed solvent to lower and buffer reaction pH and, like carbon dioxide, will be present at some concentration within the reaction interphase through selective solubility.

The pH of the reaction solvent is preferably less than 7 to promote carbonic acid formation. Carbonate ions ($CO_3^{2-}$) promote decomposition through the scavenging of hydroxyl ions ($OH^-$) produced during supercritical ozone reaction with water ($H_2O$). Moreover, carbonated water (carbonic acid) serves as a buffering medium—controlling the pH between 7 and 10 and thus preventing the formation of highly acidic or alkaline reaction products, which may attack substrate metalization. Also, within this pH range supercritical ozone reactions are optimized.

Under these conditions, a reaction solvent comprising water, supercritical ozone, and supercritical carbon dioxide and carbonic acid is formed. As shown in FIG. 8B, the supercritical ozone 64 selectively concentrates within the reaction interphase 24 and solubilizes the organic resist layer 28. The solubilized resist is then transported from the substrate 66 and into the reaction feed solvent phase 26. FIG. 8C shows the cleaned wafer via 28b without resist present.

Figure 10:
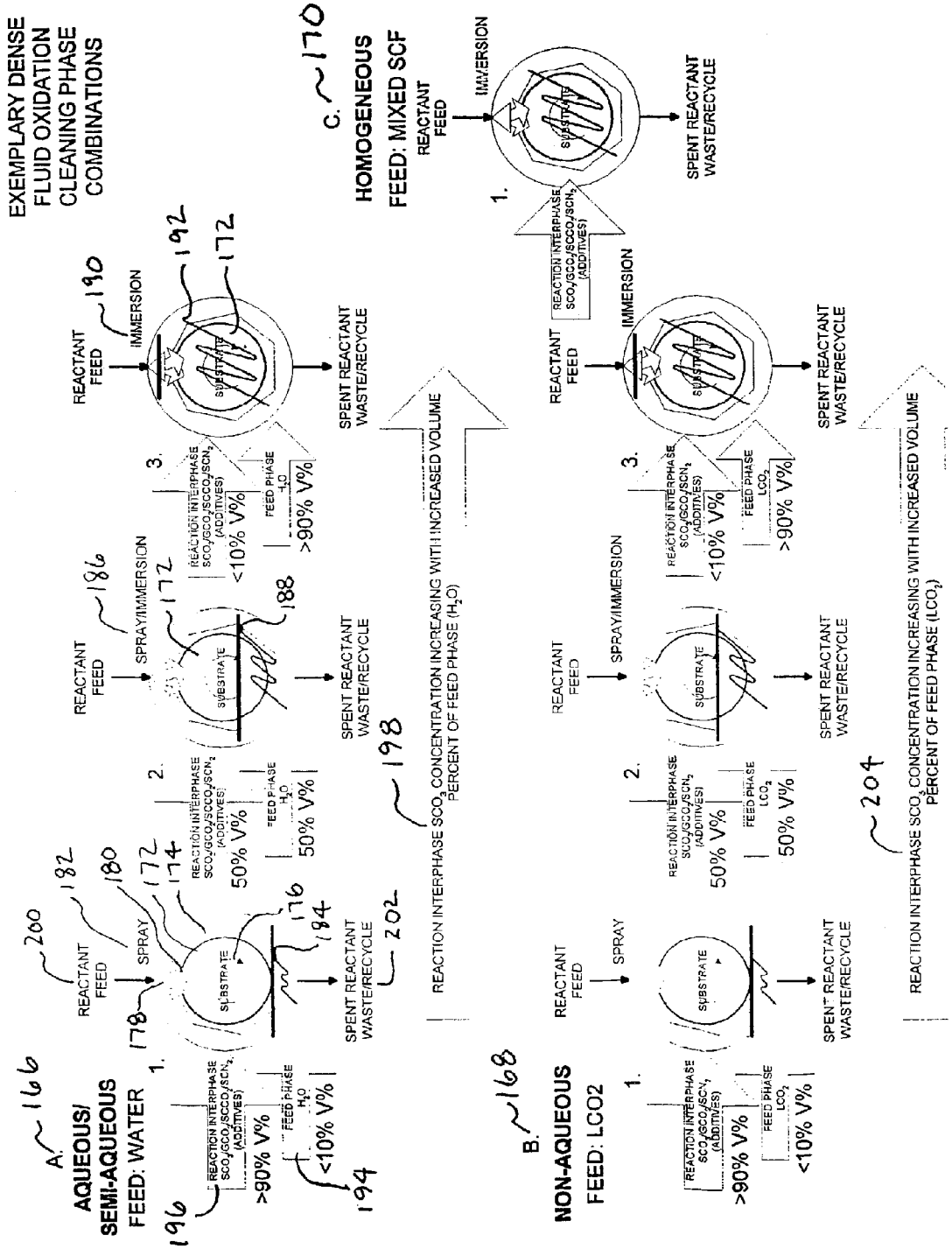
FIGS. 10A–C are flow diagrams illustrating alternative embodiments of the inventive process.

FIGS. 10A–C illustrate various reaction interphases and selective contact of the substrate-contaminant with the reaction phase. Substrates containing contaminants may be cleaned using the present invention with the substrate completely immersed in the reaction solution or maintained within a spray of the reaction solvent phase only.

Moreover, the substrate can be processed in aqueous/semi-aqueous solutions 166, non-aqueous solutions 168, and homogeneous non-aqueous solutions 170. The chemistry of supercritical ozone reactions are different in aqueous and nonaqueous phases. In nonaqueous phases, the ozone molecule will react directly with the organic contaminant (ozonolysis)—forming ozonides as intermediate products. Moreover, metallic salts present on the substrate or contained within the contaminant are readily removed as hydroxides or oxides when the feed phase in nonaqueous.

The aqueous 166 and non-aqueous 168 phase combinations have a wafer substrate coated with a resist 172 mounted on a rotating base 174, which spins the wafer in a clockwise or counterclockwise direction 176. A spray manifold 178 located above the rotating wafer 172 delivers the reaction solvent 180 over the rotating substrate 172. Pressure, temperature and phase mixture composition is controlled to provide three types of phase contact combinations as follows: 1. A spray only application 182 with the reaction solvent feed phase level 184 located below the rotating wafer, 2. A spray/immersion application 186 with the liquid phase 188 level located near the middle of the rotating wafer 172, and 3. An immersion application 190 with the rotating wafer 172 completely immersed 192 within the liquid phase. During application of the reaction solvent feed 200 in combination with the removal of spent reactant wastes 202 contained in the reaction feed solvent, the rotating wafer 172 continues to spin at a rate of between 2 and 200 RPM to provide mechanical shearing energy. The non-aqueous phase combinations also provide control of selectivity and reactivity 204 through stoichiometric delivery of liquid phase carbon dioxide and near-critical/supercritical ozone and selective substrate contact as above.

As seen in FIG. 10C, the homogeneous phase combination 170 is essentially a uniform phase comprising near-critical or supercritical ozone in combination with a bulk supercritical fluid such as carbon dioxide or nitrogen. Application of the reactant feed to the substrate is essentially the same as immersion phase applications described above.

Another embodiment of the present invention provides a mechanism for drying the substrates following cleaning operations. Wetting and de-wetting (drying) a substrate depends upon the following factors:

> $S.T.$ solid>$S.T.$ liquid–wetting occurs
>
> $S.T.$ liquid>$S.T.$ solid–wetting does not occur (de-wetting)

Dense carbon dioxide present during the ozone reaction phase is used to de-wet or dry the substrate following supercritical ozone treatment. The reaction solvent is modified so that it contains dense carbon dioxide, but not ozone or water. The modified reaction solvent is applied during draining of carbonated/ozonated water from the reaction chamber under isothermal and isobaric conditions. Dense carbon dioxide present at the substrate-dense fluid interphase has much lower surface tension than the substrate (solid phase) and water (liquid phase)—preventing condensation of water vapor onto substrate surfaces during draining. This is done through displacement of water from the substrate as the fluid mixture recedes from the substrate. Dense phase carbon dioxide is preferred due to its lower surface tension as compared to water and substrate. Following the initial drain and the gross drying, dry carbon dioxide under supercritical fluid or liquid state conditions is used as a precision drying agent to remove trace amounts of absorbed moisture from the substrate.

Figure 11:
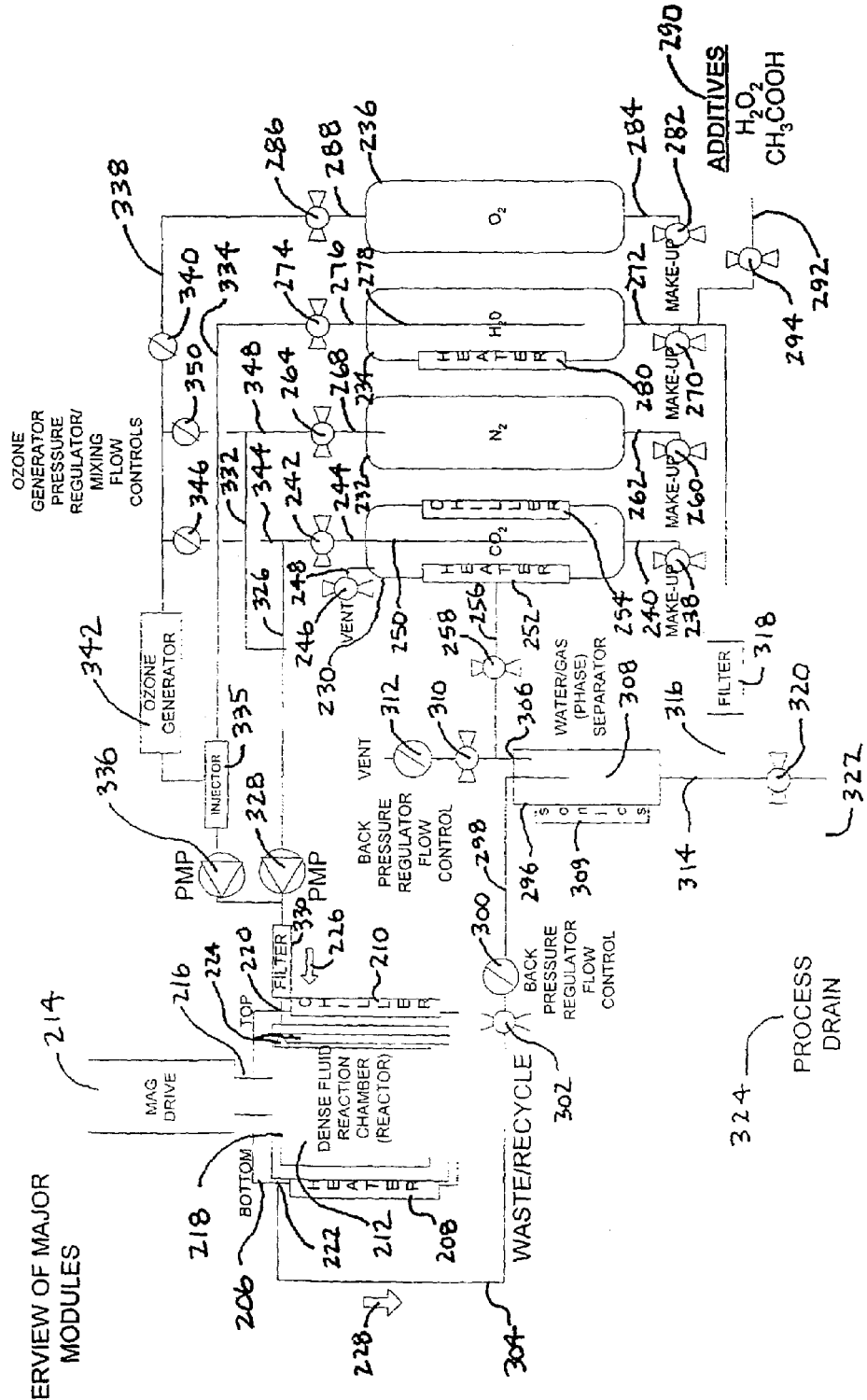
FIG. 11 is a schematic diagram of an apparatus in accordance with the invention including an integrated fluids processing and management system.

FIG. 11 illustrates a dense fluid oxidation cleaning and drying system schematic with integrated fluids processing and management system. Carbon dioxide, nitrogen, and oxygen are all available as bulk liquids or gases and in a variety of chemical purity levels. Deionized water is typical made on-site from tap water using ion exchange media technology. Using pressure and temperature control, carbon dioxide can be used as a gas, liquid or supercritical fluid phase solvent. Nitrogen can be used as a gas or supercritical fluid phase solvent. Ozone can be created ex-situ or in-situ using a conventional oxygen-fed silent discharge ozone generator and can be used as a near-critical or supercritical phase solvent. Moreover, the present invention provides unique devices for generating supercritical ozone in-situ using a blend of carbon dioxide, nitrogen and oxygen under supercritical conditions. In addition, ozone can be created ex-situ and delivered with carbon dioxide and/or nitrogen into the reaction chamber using carbonated deionized water as a feed solvent.

The apparatus for performing the present invention has a stainless steel high pressure vessel or reactor 206 which includes a quick closure, various inlet and outlet ports to receive and discharge fluids and incorporates liquid level, pressure, and temperature sensors to manage fluid environment conditions (all not shown). In addition, the reactor 206 is integrated with a heating system 208 and cooling system 210 to control internal reactor fluid temperature conditions 212. The reactor 206 is also integrated with a magnetic drive shaft 214, which is integrated through a high-pressure port 216 and attached to an internal rotable fixture 218, which contains the substrate (not shown) to be processed in accordance with the present invention. The reactor 206 contains at least one inlet port 220 located at the top of the reactor 206 and at least one outlet port 222 located at the bottom of the reactor for receiving and discharging the active and spent reaction feed solvent, respectively. The inlet port 220 is connected to an internal spray head 224. The fluid flow scheme is represented by an inlet flow arrow 226 and outlet flow arrow 228.

The apparatus includes four stainless steel high pressure fluid supply tanks as follows: a high pressure tank 230 containing carbon dioxide in liquid, gas, or supercritical state, a high pressure tank 232 containing nitrogen gas, a high pressure tank 234 containing liquid deionized water (and additives), and a high pressure tank 236 containing oxygen gas. Each tank described above contains at least one inlet and outlet port for receiving and discharging fluids.

The carbon dioxide supply tank 230 contains an inlet valve 238 and inlet feed line 240, an outlet valve 242 and outlet feed line 244 and a vent valve 246 and vent line 248. Carbon dioxide from a bulk supply is fed through inlet valve 238 and line 240 into the supply tank 230. Lighter gases such as nitrogen and oxygen accumulated in the recycled carbon dioxide supply during dense fluid oxidation processes of the present invention are periodically vented through the vent line 248 and valve 238. The carbon dioxide supply tank outlet line extends into the lower hemisphere of the tank 250 so that when a liquid phase is present in the tank, it may be withdrawn from the tank. Also attached to the carbon dioxide supply is a heater system 252 for heating carbon dioxide fluid to supercritical temperatures and a chiller system 254 for cooling carbon dioxide fluid to below supercritical temperature. The carbon dioxide supply tank has a recycle inlet port and inlet feed line 256, which is connected to an inlet valve 258 for receiving a recycled carbon dioxide. The carbon dioxide supply tank 230 contains pressure and temperature sensors (both not shown) to monitor fluid feed properties.

The nitrogen gas supply tank 232 contains an inlet valve 260 and inlet feed line 262, an outlet valve 264, and outlet feed line 268. Nitrogen from a bulk supply is fed through inlet valve 260 and line 262 into the supply tank 232. The nitrogen gas supply tank 232 contains pressure and temperature sensors (both not shown) to monitor fluid feed properties.

The deionized water supply tank 234 contains an inlet valve 270 and inlet feed line 272, an outlet valve 274, and outlet feed line 276. Deionized water from an external supply source is fed through inlet valve 270 and line 272 into the supply tank 234. The deionized water supply tank outlet line extends into the lower hemisphere of the tank 278 so that it may be withdrawn from the tank. The deionized water supply tank 234 also contains a heating system 280, which heats the deionized water to the desired reactor fluid inlet temperature and also contains pressure and temperature sensors (both not shown) to monitor fluid feed properties.

The oxygen gas supply tank 236 contains an inlet valve 282 and inlet feed line 284, an outlet valve 286 and outlet feed line 288. Oxygen from a bulk supply is fed through inlet valve 282 and line 284 into the supply tank 236. The oxygen gas supply tank 236 contains pressure and temperature sensors (both not shown) to monitor fluid feed properties.

The apparatus contains an additive injection system 290 which meters controlled quantities of reaction modifiers (i.e., hydrogen peroxide, acetic acid) through feed line 292, feed valve 294 and into the deionized water supply tank 234 through feed valve 270 and inlet line 272.

The apparatus contains a fluid phase separator 296 which receives spent reactor fluid through inlet line 298, pressure regulator 300, and waste fluid valve 302 from reactor outlet port 220 and outlet line 304. The phase separator 296 contains a vent/recycle gas port and line 306, which delivers separated gases ($CO_2/N_2/O_2$) from spent reactor liquid phase (i.e., deionized water/additives) within the separator interior 308. An ultrasonic transducer 309 is affixed to the separator 296, which is used to sonicate the spent reactor fluid mixture to assist in degassing the liquid phase. Separated gases flow through vent valve 310 and vent pressure regulator 312 and are vented to the atmosphere. Alternatively, separated gases flow through recycle valve 258 and line 256 and into the carbon dioxide storage tank 230. Lighter gases such as oxygen and nitrogen are vented from the carbon dioxide storage tank 230 through vent valve 246 and line 248. Spent reactor liquid phase which has been separated from the gas phases flows through drain line 314 and flows through recycle line 316, filter element 318, inlet valve 270, inlet line 272 and into deionized water storage tank 280 for reuse. When recycling reactor fluid is not desirable, spent reactor liquid water flows through drain line 314, through drain valve 320 and drain line 322 into a suitable process waste receiver 324.

Finally, the apparatus contains a series of gas phase and liquid phase feed lines from the various outlets of the storage tanks described above and which are connected to a common inlet port 220 into the reactor 206. The outlet line 244 from the carbon dioxide storage tank 230 is connected to outlet line 326 and booster pump 328 through filter element 330 and into reactor 206 via inlet port 220. The outlet line 268 from the nitrogen supply tank 232 is connected to outlet line 332 and connected to gas pressure booster pump 328 through filter element 330 and into reactor 206 via inlet port 220. The outlet line 276 from the deionized water storage tank is connected to outlet line 334, ozone injector/mixer 335, and connected to liquid pressure booster pump 336 through filter element 330 and into reactor 206 via inlet port 220. The outlet line 288 from the oxygen storage tank 236 is connected to outlet line 338 through gas pressure regulator 340, into ozone generator 342, into liquid phase injector/ mixer 335, into liquid pressure booster pump 336 through filter element 330 and into reactor 206 via inlet port 220.

Carbon dioxide and nitrogen gas may be blended with the oxygen feed source into the ozone generator 342 to provide dense fluid admixturing prior to generating near-critical or supercritical ozone. Carbon dioxide gas flows through outlet line 244 from the carbon dioxide storage tank 230, through valve 242, blending feed line 344, carbon dioxide blending regulator 346 and into the oxygen feed gas line 338. Nitrogen gas flows through outlet line 268 from the nitrogen gas storage tank 232, through valve 264, blending feed line 348, nitrogen-blending regulator 350, and into the oxygen feed gas line 338.

FIGS. 12A and B illustrate a high-pressure stainless steel vessel 206, which contains a heating jacket 208 and cooling jacket 210 on the exterior surface to vary internal reactor temperature 212. Within the pressure reactor is a rotable fixture or drum 218, which contains the substrates 352.

The reactor features two hemispheres, an upper hemisphere and a lower hemisphere. Reactant solvent 354 is fed into the upper hemisphere via inlet port 220 and through a manifold containing numerous spray nozzles 224. Reaction solvent sprays 356 over the rotating (or stationary) patterned wafer 358 using an external magnetic drive 214 coupled through the reactor 206 and affixed to the rotable fixture 218 containing the patterned wafers. Spent reactor fluids are collected at the lower hemisphere outlet port 222 and withdrawn from the reactor for recovery or disposal. Liquid level, pressure, and temperature sensors (all not shown) are used to control the physicochemistry of the reaction environment.

As illustrated in FIG. 12B, the reactor may be any orientation (vertical to horizontal) as shown by arrow 360. Moreover, a quick opening and closing door 362 is sealed against the opening face 364 to the reactor 206 as shown by arrow 366.

Figure 18:
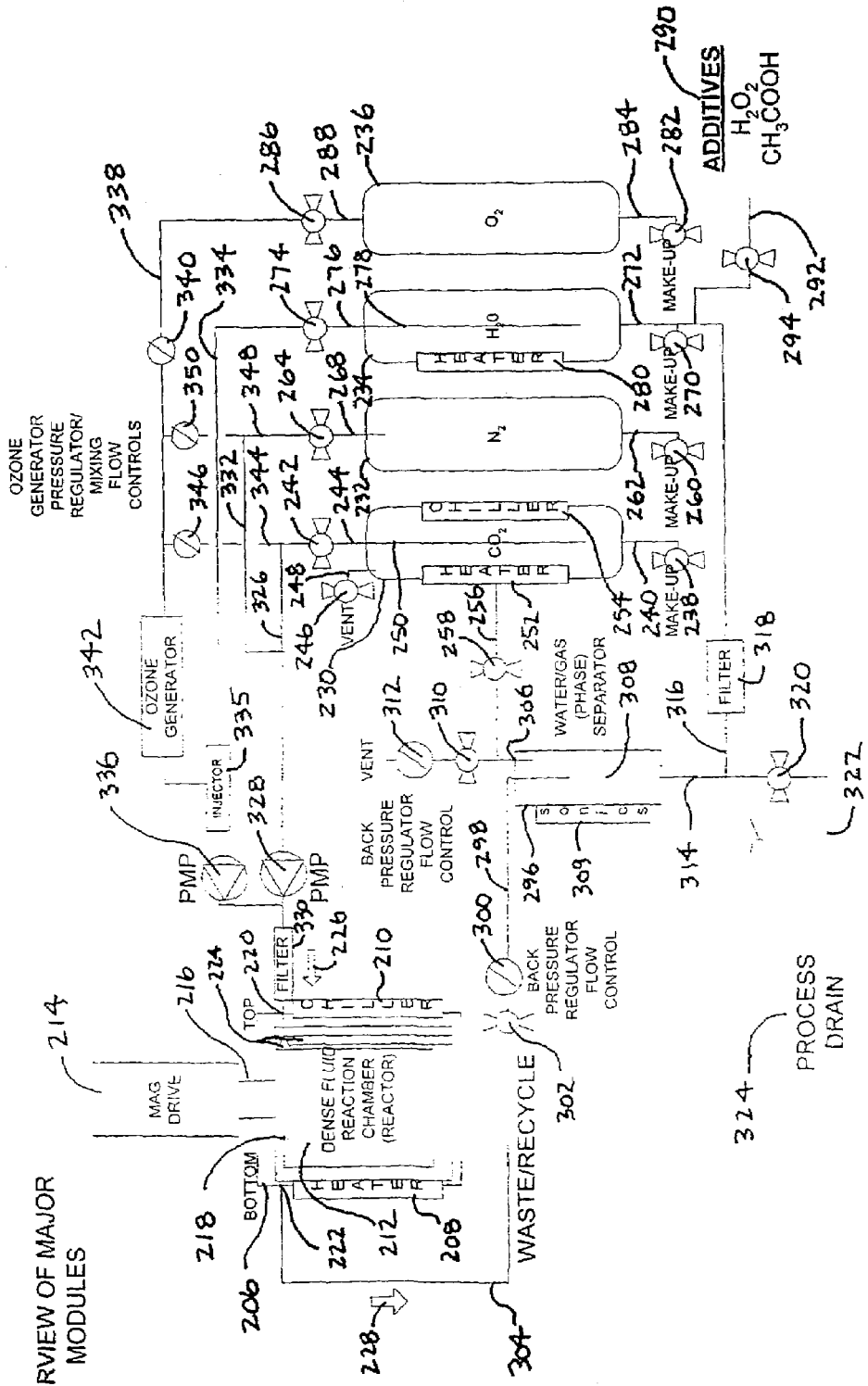
FIG. 18 is a flow diagram illustrating a fifth embodiment of the inventive process.
Figure 21A:
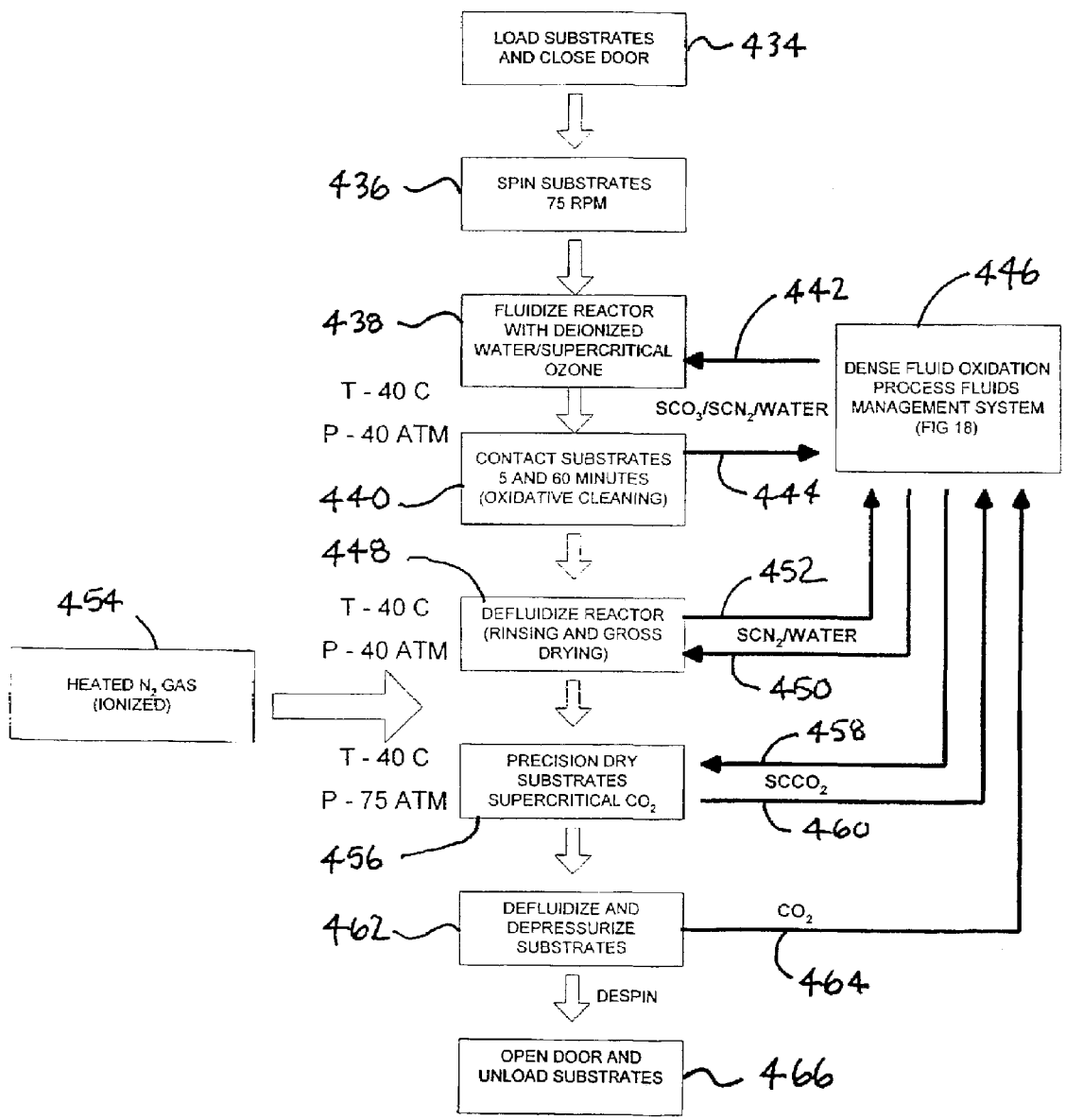
FIG. 21a is a flow diagram illustrating an exemplary process to the present invention.
Figure 21B:
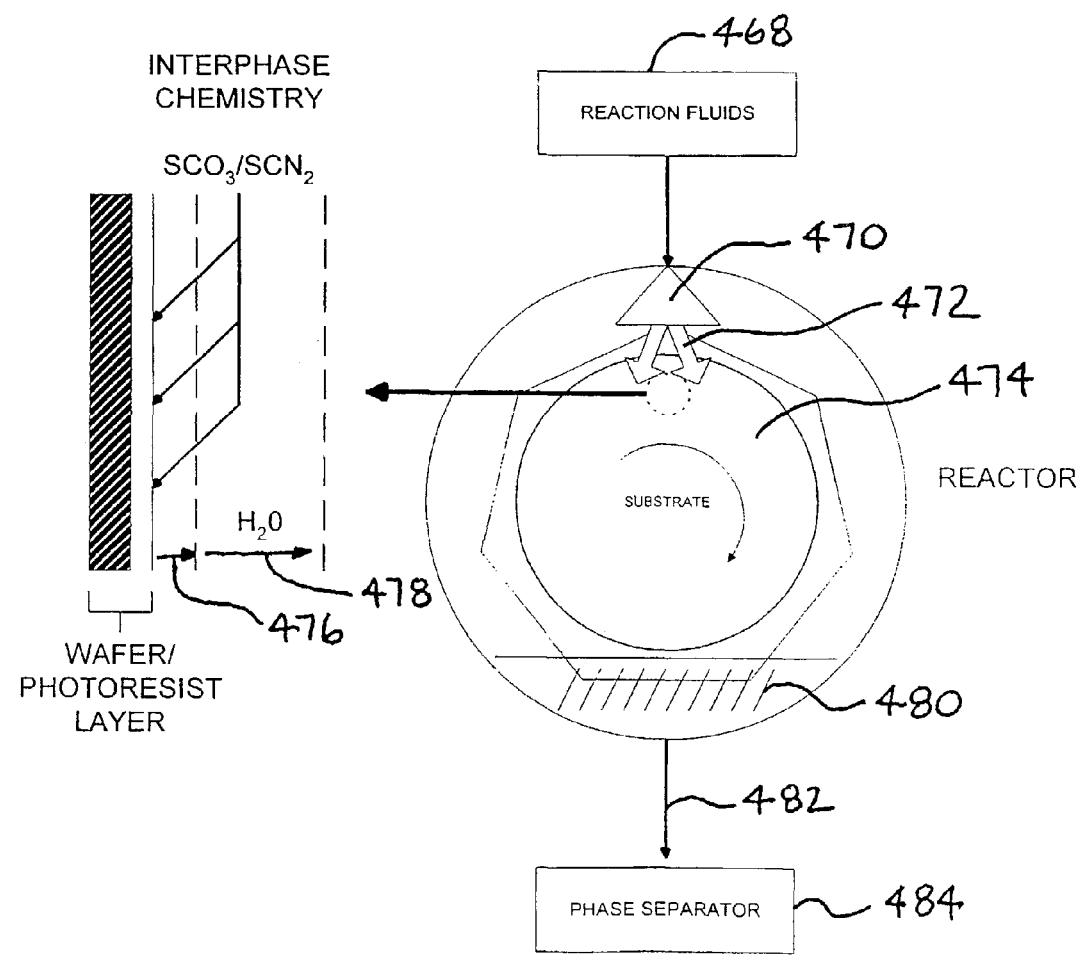
FIG. 21b illustrates an exemplary process dynamics according to the present invention.

FIGS. 13A–C illustrate devices for creating near critical and supercritical ozone and ozonated mixtures for use with the present invention. Illustrated in FIG. 13A is a UV-catalyzed supercritical ozone generator. The device has a cylindrical stainless steel high-pressure tube 368, which contains an inner cylindrical UV reflective sleeve 370. Affixed to the stainless steel tube 368 is a quartz high-pressure window 372, through which is passed intense ultraviolet radiation, preferably at the wavelength of 184.9 nm. A mixture of nitrogen gas and/or carbon dioxide gas and oxygen gas 374 is fed into the ozone generator at a pressure of between 35 and 200 atm via an inlet port 376 and passed into the interior 378 of the UV generator tube whereupon the dense gas mixture is irradiated with ultraviolet light, creating a mixtures of supercritical ozone, carbon dioxide gas and/or nitrogen gas. The supercritical ozone mixture 380 is fed out of the ozonator through an outlet port 382. The feed mixture for the dense fluid ozonator is derived from blending feed gases from the dense fluid oxidation cleaning and drying system (FIG. 18) via feed line 338. The discharge from the dense fluid ozonator is fed into reactor 206 (as seen in FIG. 18) via inlet feed port 220.

FIG. 13B illustrates a device featuring a corona discharge for generating supercritical ozone. The device has a cylindrical stainless steel high-pressure tube 384, which contains an inner cylindrical Teflon electrical insulation sleeve 386. Affixed to one side of the stainless steel tube 384 is a high voltage electrical source feed 388 and to the other side is a high voltage electrical ground feed 390. Affixed to the high voltage electrical source feed is a semi cylindrical stainless steel plate 392, which contains a dielectric coating 394 to prevent arcing to the ground. Affixed to the high voltage ground feed 390 is a semi cylindrical stainless steel plate 396. High voltage is applied through feed 388 and plate 394 on its face, which creates an intense electrical field (corona/plasma) within the interior areas 398 between the two plates. The electric field ionizes oxygen and forms supercritical ozone. Significant heat is generated which is detrimental to supercritical ozone formation and is extracted using a coolant heat exchanger 400 which is affixed to the dense fluid ozonator exterior walls 384. A mixture of nitrogen gas and/or carbon dioxide gas and oxygen gas 402 at a pressure of between 35 and 200 atm is fed into the ozone generator via an inlet port 404 and passed into the interior 398 of the corona generator tube whereupon the dense gas mixture is exposed to the electric field, creating a mixtures of supercritical ozone, carbon dioxide gas and/or nitrogen gas. The supercritical ozone mixture 406 is fed out of the ozonator through an outlet port 408. The feed mixture for the dense fluid ozonator is derived from blending feed gases from the dense fluid oxidation cleaning and drying system (FIG. 11) via feed line 338. The discharge from the dense fluid ozonator is fed into reactor 206 (as seen in FIG. 11) via inlet feed port 220.

FIG. 13C illustrates a device that features ozone-gas injection into water with a pressure booster pump for generating supercritical ozone. The device has a cylindrical stainless steel high-pressure tube 410, which contains an inner static mixing device 412. Affixed to the stainless steel tube 410 is an ozone injection line 414, through which is passed ozone gas 416 at a pressure of between 1 and 5 atm and at a concentration of between 2% and 20% by weight of ozone in oxygen, nitrogen and/or carbon dioxide gas carriers into the interior mixing section of the ozonator 418. A mixture of deionized water and additives 420 is fed at a pressure of between 1 and 3 atm via an inlet port 422 and passed into the interior 418 of the ozonator whereupon the ozone gas 416 and deionized water and additives 420 are mixed using the in-line static mixer 412. The ozonated mixture 424 is fed into the inlet of a liquid pressure-boosting pump 426, whereupon the mixture is compressed to near-critical or supercritical pressures 428 as shown. The supercritical ozone-water mixture 430 is fed out of the booster pump 426 through a discharge port 432. The feed mixture for the dense fluid ozonator is derived from blending feed gases from the dense fluid oxidation cleaning and drying system (FIG. 11) via ozone feed line 338 and deionized water feed line 334. The discharge from the dense fluid ozonator is fed into reactor 206 (FIG. 11) via inlet feed port 220.

Having thus described the components and functions of the dense fluid ozonation cleaning and drying system and process fluids management system, the following is a discussion of an cleaning process (patterned wafers) employing said devices and functionality.

Figure 12:
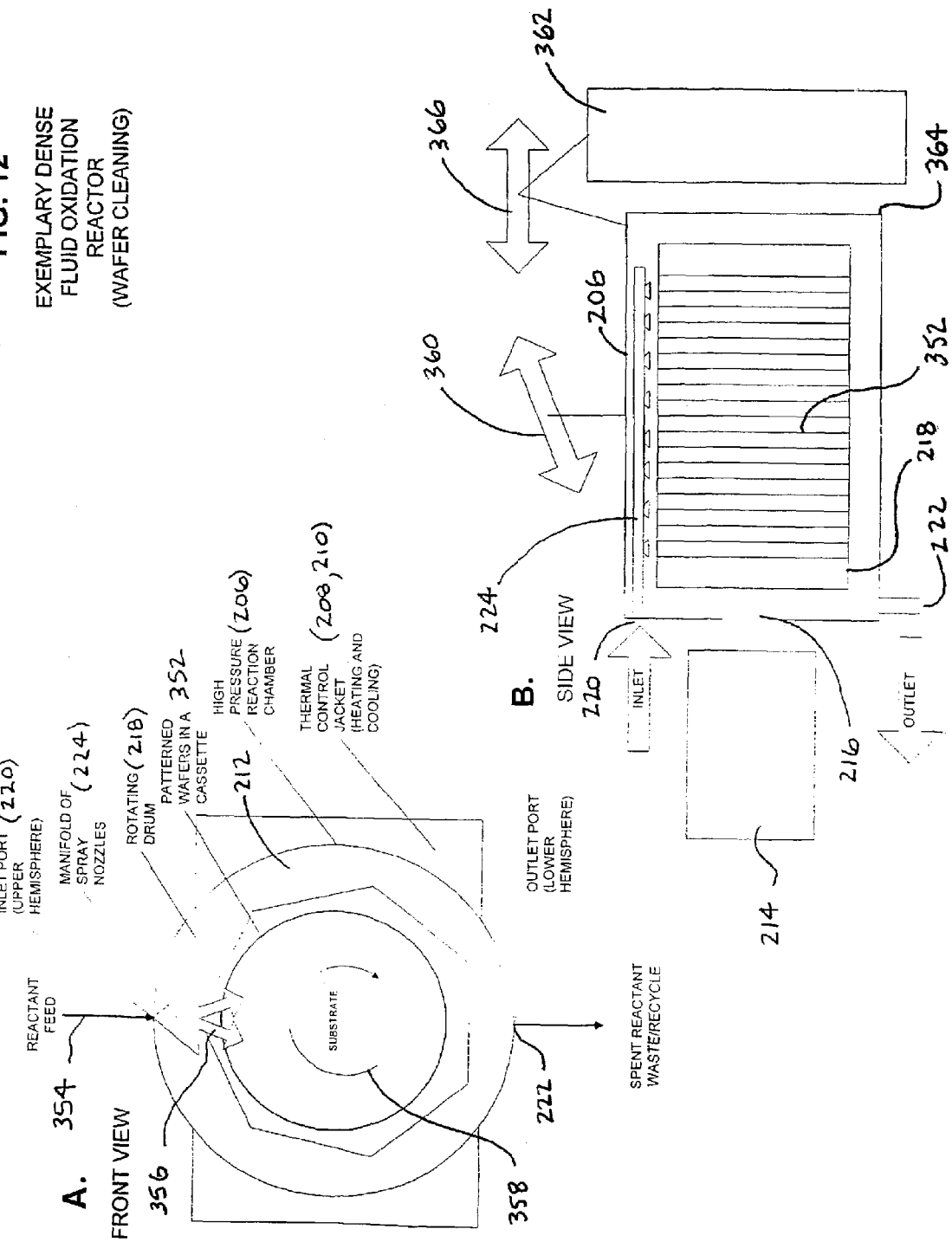
FIGS. 12A and B are front and side vies of a reactor useful in accordance with the invention.
Figure 14A:
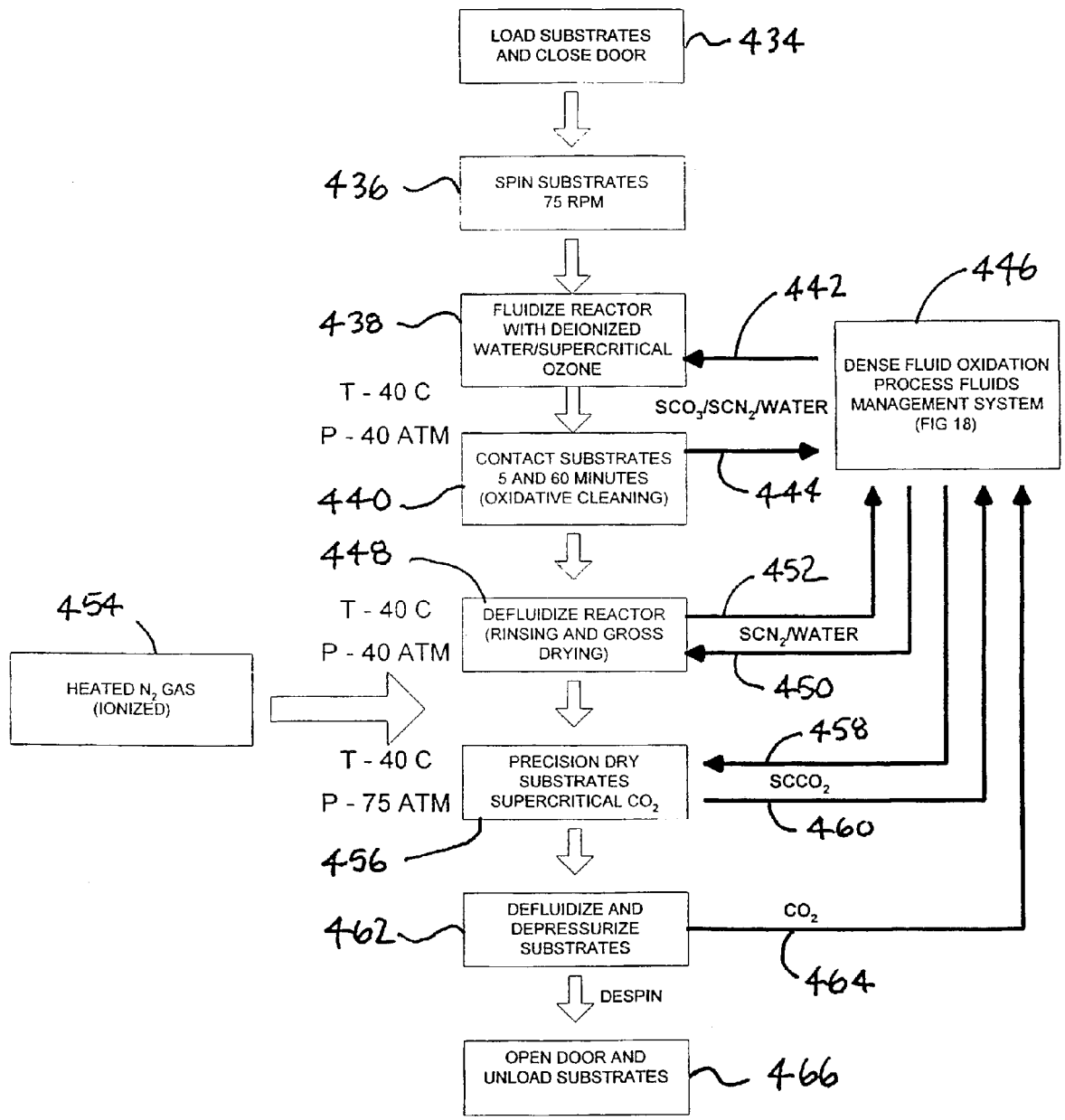
FIG. 14A is a flow diagram illustrating an embodiment of inventive process.

FIGS. 14A and B are flowcharts illustrating a dense fluid oxidation cleaning and drying process for treating patterned wafers, and process dynamics, respectively. Referring to the FIG. 14A, a cassette of patterned wafers is loaded 434 into the reactor 206 (FIG. 11), preheated using heating system 208 (FIG. 11) to a temperature of 40° C., and the door is closed 362 (FIG. 12) and sealed 366 (FIG. 12). The wafers are spun 436 at a rate of 75 rpm. During this step, the reactor containing the spinning wafers is fluidized 438.

Referring additionally to FIG. 11, deionized water contained in deionized water supply tank 234, and preheated using tank heater 280 to a temperature of 40° C., is pumped using liquid booster pump 336 from the water tank through opened feed valve 274, delivery line 276 and delivery line 334 to the ozone injector/mixer 335. Oxygen gas contained in oxygen gas storage tank 236 is fed through opened feed valve 286, delivery line 288, delivery line 338 and through gas pressure regulator 340 into the ozone generator 342 and into the ozone injector/mixer. Nitrogen gas is fed into the oxygen gas prior to entering the ozone generator 342 by opening feed valve 264 whereupon nitrogen gas is injected into the oxygen gas using pressure regulator 350 as required to provide the proper mixing ratio of nitrogen in oxygen. As such an ozonated mixture comprising ozone and nitrogen gas is fed into ozone injector/mixer 355 and mixed with the deionized water as shown in FIG. 13C. This mixture is then fed into the inlet of liquid booster pump 336. Simultaneously, nitrogen gas is fed through feed line 332 and into gas booster pump 328. The aqueous ozonated mixture is pressurized with the nitrogen gas and fed into the reactor 206 through reactor inlet 220 and filter element 330. The pressurized mixture enters the reactor through internal spray manifold 224 and is sprayed over the rotating patterned wafers. During this operation, the reactor waste outlet valve 302 is opened and the pressurized mixture exits through the drain line 304 and is fed through a backpressure control regulator 300. By controlling the gas booster pump 328 feed rate, liquid pressure booster pump 336 feed rate and back pressure regulator 300, the internal reactor pressure is maintained at the desired fluidizing pressure, is this example 40 atm. Under these conditions, the wafers are contacted with a mixture of supercritical ozone, supercritical nitrogen, and deionized water.

Returning to FIG. 14A, the patterned wafers are centrifugal spray rinsed and reacted 440 with the dense fluid ozonated mixture for a predetermined contact time of between 5 and 60 minutes at a reactor temperature of 40° C. and a reactor pressure of 40 atm. The reactant feed mixture is continuously applied 442 and withdrawn 444 from the reactor and exchanged with the process fluids management system 446.

As seen in FIG. 11 the spent reaction fluid is fed from the reactor 206 through the opened drain valve 302, through pressure regulator 300, through waste drain line 298 and into the separator 296, whereupon the mixture of spent reaction fluid is separated into gas and deionized water. The gas fraction is vented to the atmosphere through vent valve 310 and vent pressure regulator 312. The liquid phase fraction containing oxidized wafer substrate contaminants is discharged through separator drain valve 320 and separator drain line 322 to an appropriate facilities process drain 324.

Figure 14B:
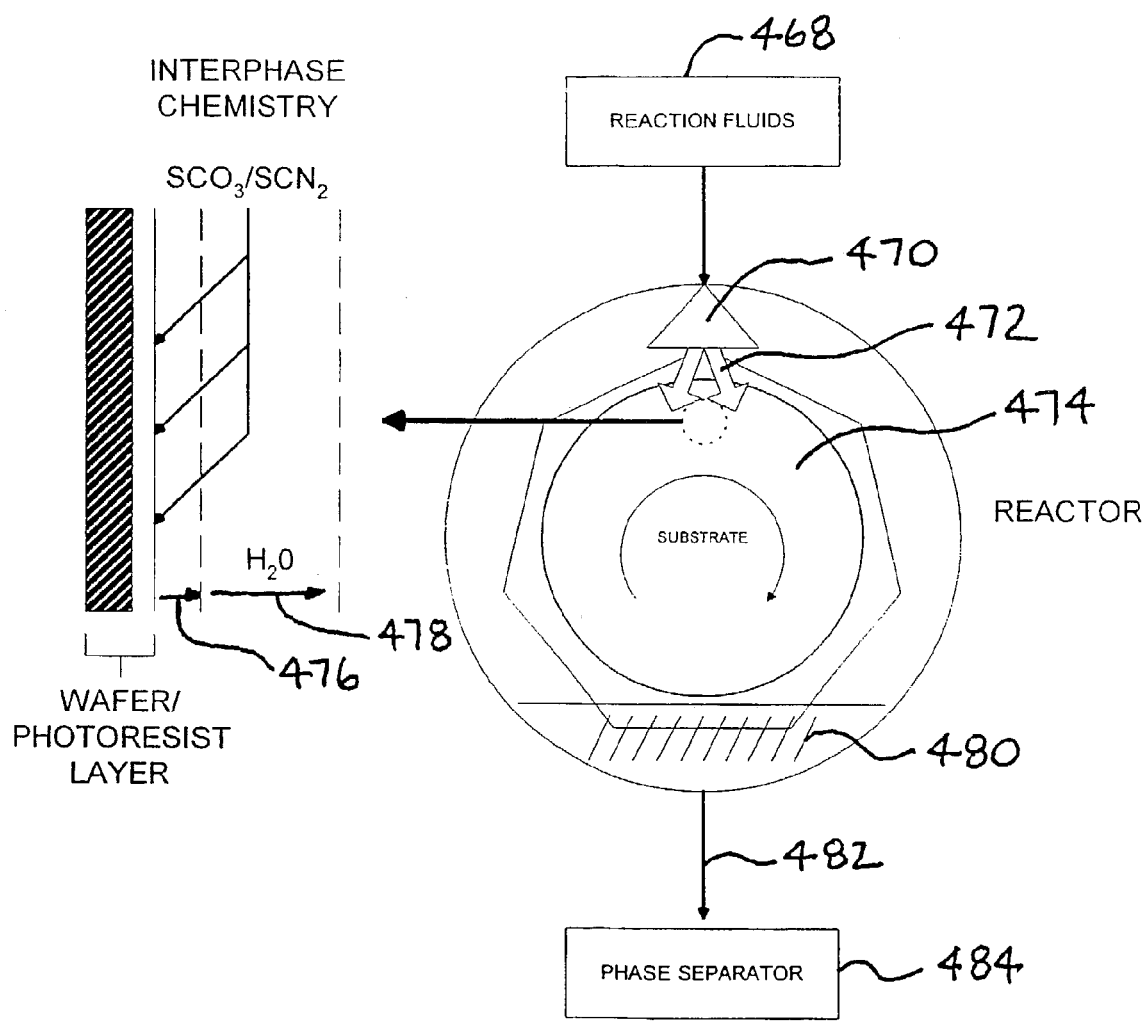
FIG. 14B is a flow diagram illustrating the process dynamics for the embodiment of the inventive process.

As seen in FIG. 14B, following the dense fluid ozonation process the reactor is defluidized as follows. The ozonator 342 (FIG. 11) and ozonator feed gases are turned off and the reactor is continued to be fluidized for several minutes, thereby rinsing any residual supercritical ozone and reacted contaminants from the wafer 448 surfaces using the same reaction fluid feed 452 and reaction fluid discharge 452 and reaction fluid separation and disposal operations as described above, except without supercritical ozone present in the feed solvent. Under these conditions, the wafers are rinsed of gross residual reactants and residues. Referring to FIG. 11, while maintaining nitrogen gas pressure at 40 atm, the liquid booster pump 336 is turned off, the deionized water storage tank outlet valve 274 is closed and the reactor is allowed to drain liquid phase reaction fluids to the phase separator 296 under relatively constant pressure and temperature. The presence of a supercritical fluid under these conditions greatly aids in draining and drying the wafers simultaneously. Following this operation, the wafers and internal reactor surfaces may be further dried and deionized (remove any residual electrostatic charges) using heated ionized nitrogen (not shown).

Following rinsing and gross drying of the reacted wafers and internal reactor surfaces, the process includes the step of precision drying 456 the wafers performing one or more fluidization 458 and defluidization 460 operations using supercritical carbon dioxide to and from the process fluids management system 446.

Referring to FIG. 11, the waste/recycle drain valve 302 is closed and the reactor 206 is fluidized to a temperature of 40° C. and 75 atmospheres using carbon dioxide. Carbon dioxide contained in the carbon dioxide storage tank 230 is fed through opened feed valve 242, through feed line 244, feed line 326 and into the inlet of gas booster pump 328. The gas booster pump pressures the carbon dioxide from storage tank pressure (typically 600–1000) psi to the fluidizing pressure of 75 atm. The pressure carbon dioxide is now at supercritical pressure and is fed through filter element 330, through reactor inlet port 220, through reactor spray manifold 224 and is contacted with the wafers contained within the reactor 206. The reactor temperature raises the carbon dioxide fluid temperature to 40° C. The wafers (not shown) are contacted with supercritical carbon dioxide for 5 to 30 minutes, whereupon residual water absorbed on wafer substrate surfaces is extracted and dissolved in the supercritical carbon dioxide.

Returning to FIG. 14A, following a predetermined contact period, which may include one or more fluidizing and defluidizing operations, the reactor is depressurized 462 to remove remaining dense fluid 464 from the reactor and into the process fluids management system 446, described as follows.

As seen in FIG. 11, the waste/recycle drain valve 302 is opened and the mixture of supercritical carbon dioxide and residual dissolved water is drained from the reactor 206 via drain line 304 and through regulator 300, regulated drain line 298 and into the phase separator 296. Separated carbon dioxide gas is vented to the atmosphere through vent valve 310 or it may be cleaned and recycled back into the carbon dioxide storage tank 230 through recycle valve 258 and recycle feed inlet line 256 using a suitable booster pump and gas aerosol stripping system (both not shown).

As seen in FIG. 14A, the process is now complete and the cleaned wafers are despun to 0 rpm and may be withdrawn from the reactor following opening the closure to the reactor 466.

FIG. 14B describes the process dynamics. The reaction feed fluids 468 are introduced through the spray manifold 470 and sprayed 472 over the rotating wafer substrates 474 below. This produces a stream of distinct interphases of dense fluid reactants and water streaming over the spinning substrate surface. The reaction interphase 476 comprises supercritical ozone and supercritical nitrogen and the reaction feed solvent phase 478 comprises deionized water. The reacted mixture 480 is contained at the bottom of the reactor and is withdrawn through the outlet port 482 and flows into the phase separator 484.

EXAMPLES

Example 1

Figure 15A:
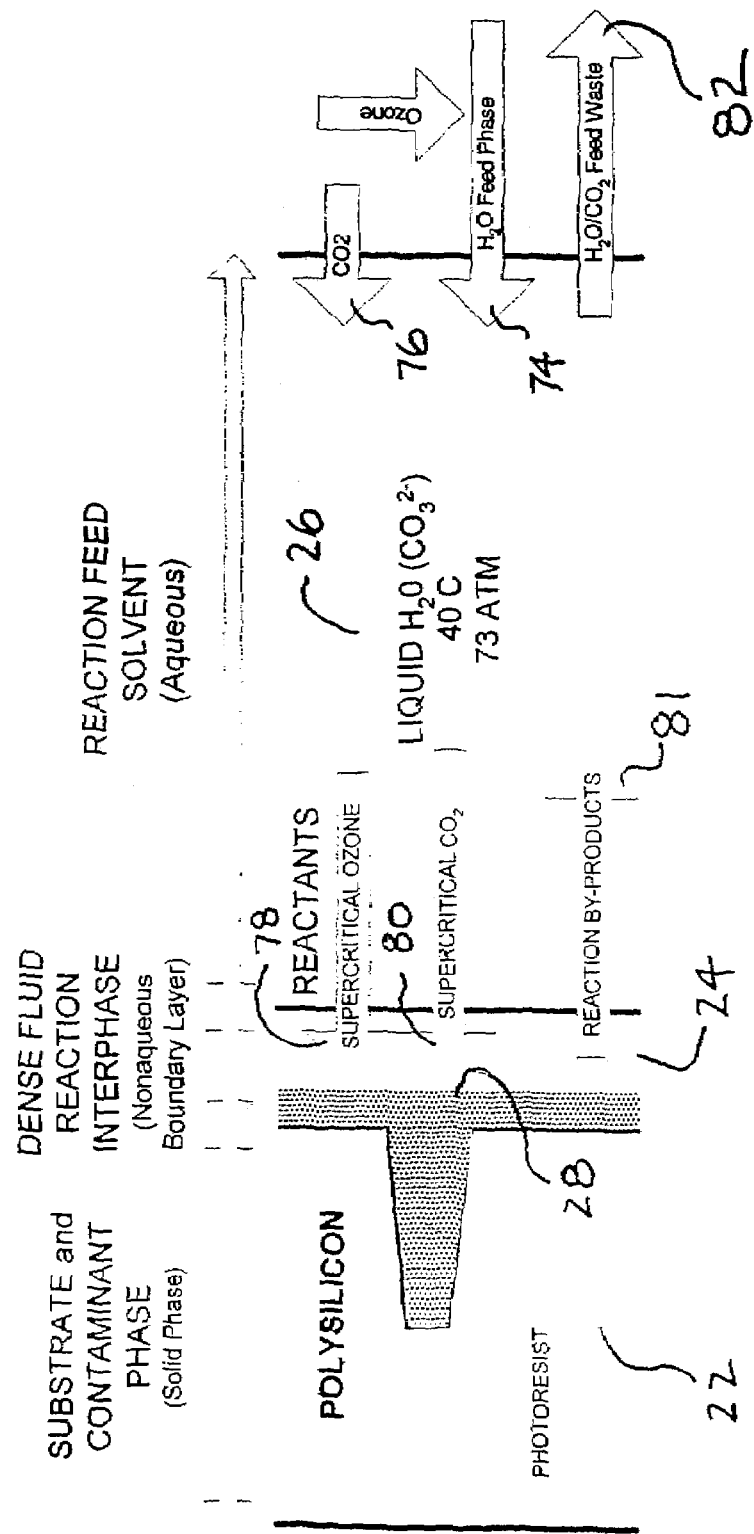
FIG. 15 is a flow diagram illustrating a second embodiment of the inventive process.
Figure 15B:
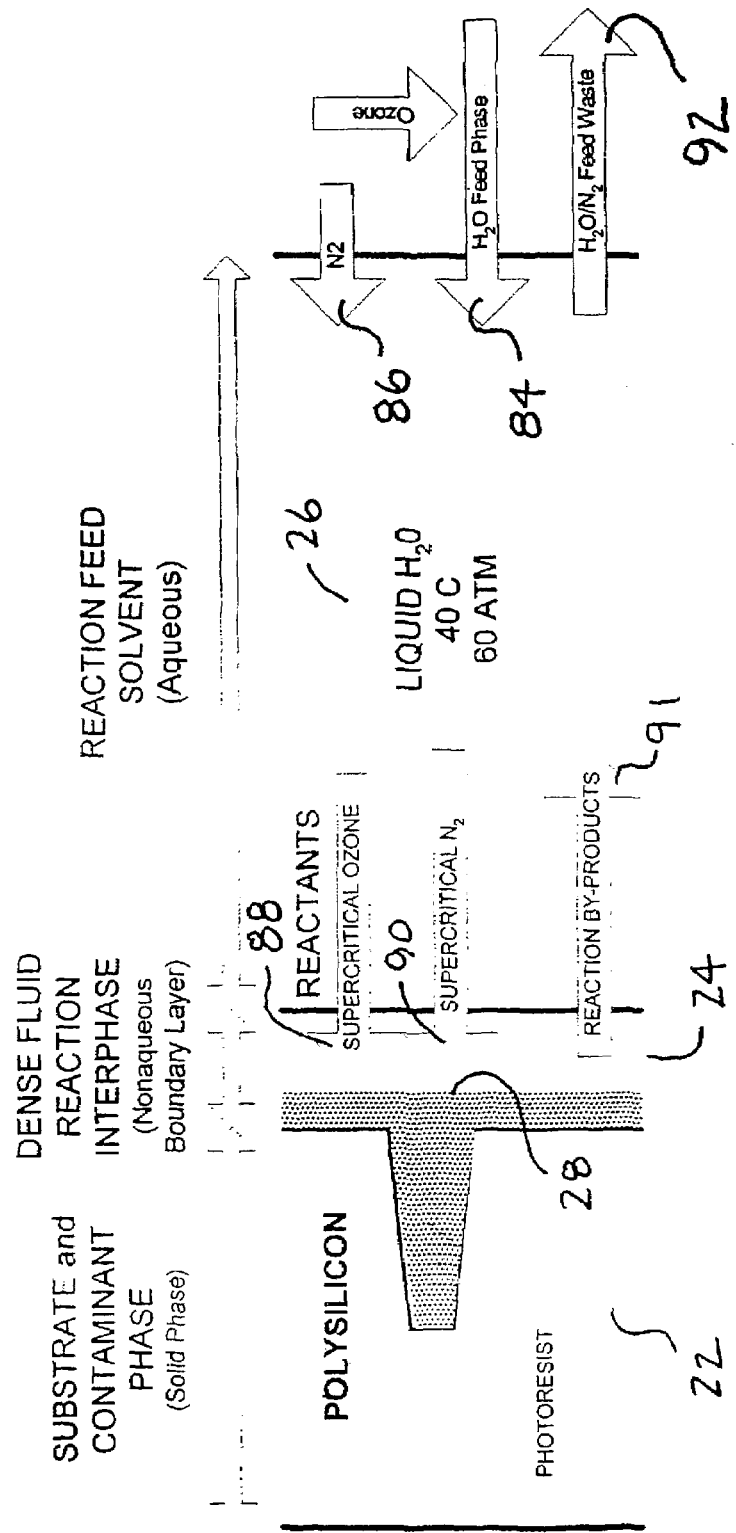

FIG. 15 gives an example dense fluid oxidation process of the present invention using water, supercritical carbon dioxide and supercritical ozone. In this example, the reactor is fluidized with deionized water containing ozone at a concentration of between 0.5% and 6.0% by volume 74 and is then fluidized with carbon dioxide 76 at a reactor temperature of 40 C and pressure of 73 atm. The pH and supercritical carbon dioxide phase concentration is controlled through stoichiometric blending of ozonated deionized water and carbon dioxide.

Under these conditions, the substrate and contaminant phase 22 is contacted with a reaction Interphase 24 comprising supercritical ozone 78 and supercritical carbon dioxide 80. The supercritical carbon dioxide component 80 permeates and swells the resist layer 28 allowing the supercritical ozone to penetrate and oxidize the surface and subsurface simultaneously. reaction by-products 81 such as water are transported into the reaction feed solvent phase 26. Carbon dioxide formed at the reaction site is fluidized and aids in the dense fluid ozonation reaction as above. Reaction by-products are carried from the reaction interphase 24 and from the reactor 82 by removing the waste reaction feed solvent under continuous or batch operation with the simultaneous recharge of fresh reaction feed solvent 74 and carbon dioxide gas 76.

Example 2

Figure 16:
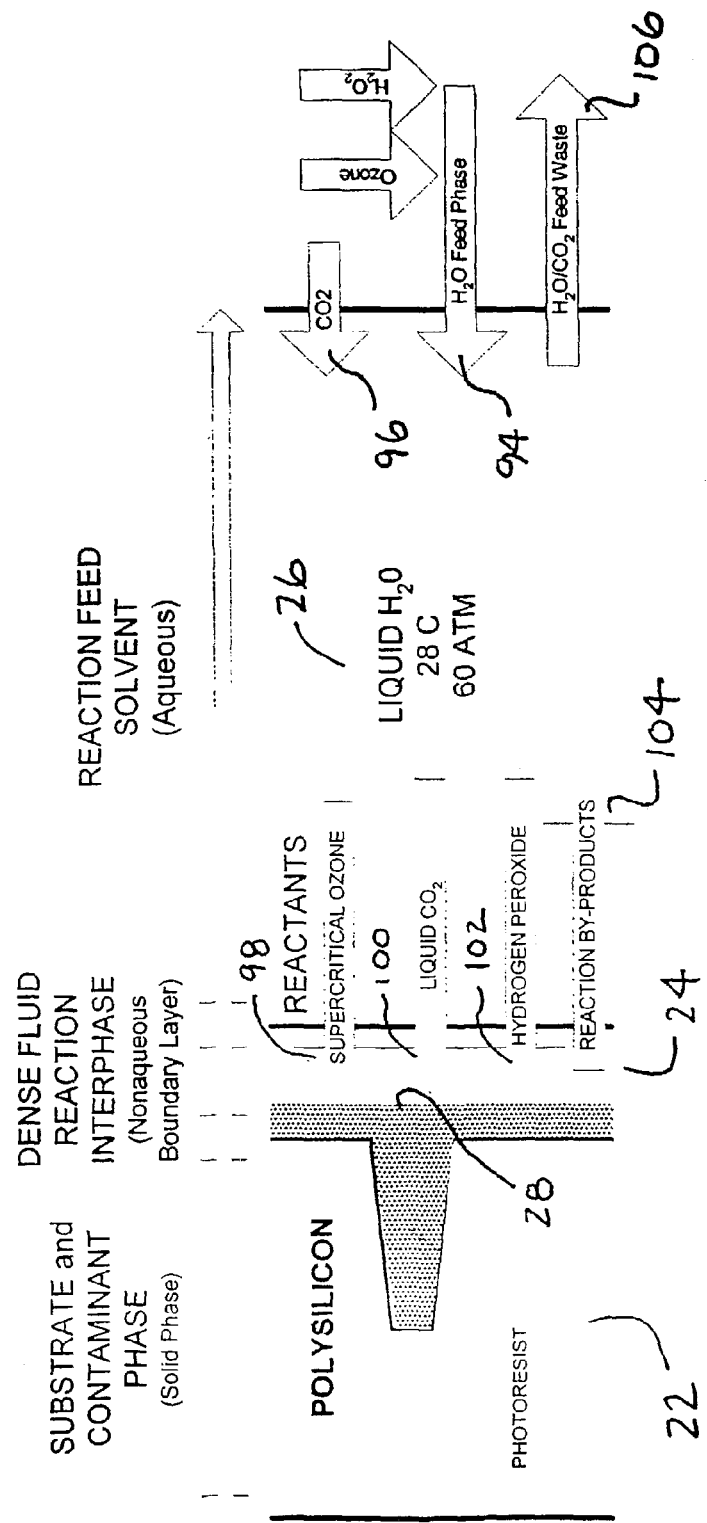
FIG. 16 is a flow diagram illustrating a third embodiment of the inventive process.

FIG. 16 gives an example dense fluid oxidation process of the present invention using water, supercritical nitrogen and supercritical ozone. In this example, the reactor is fluidized with deionized water containing ozone at a concentration of between 0.5% and 6.0% by volume 84 and is then fluidized with nitrogen 86 at a reactor temperature of 40 C and pressure of 60 atm. The supercritical nitrogen phase concentration is controlled through stoichiometric blending of ozonated deionized water and nitrogen.

Under these conditions, the substrate and contaminant phase 22 is contacted with a reaction interphase 24 comprising supercritical ozone 88 and supercritical nitrogen 90. The supercritical nitrogen component 90 permeates and swells the resist layer 28—however at a different rate than supercritical carbon dioxide due to lower solvency and less interaction with the—solid phase. Reaction by-products 91 such as carbon dioxide water are transported into the reaction feed solvent phase 26. Carbon dioxide formed at the reaction site is fluidized and aids in the dense fluid ozonation reaction as above. Reaction by-products are carried from the reaction interphase 24 and from the reactor 92 by removing the waste reaction feed solvent 26 under continuous or batch operation with the simultaneous recharge of fresh reaction feed solvent 84 and nitrogen 86.

Example 3

Figure 17:
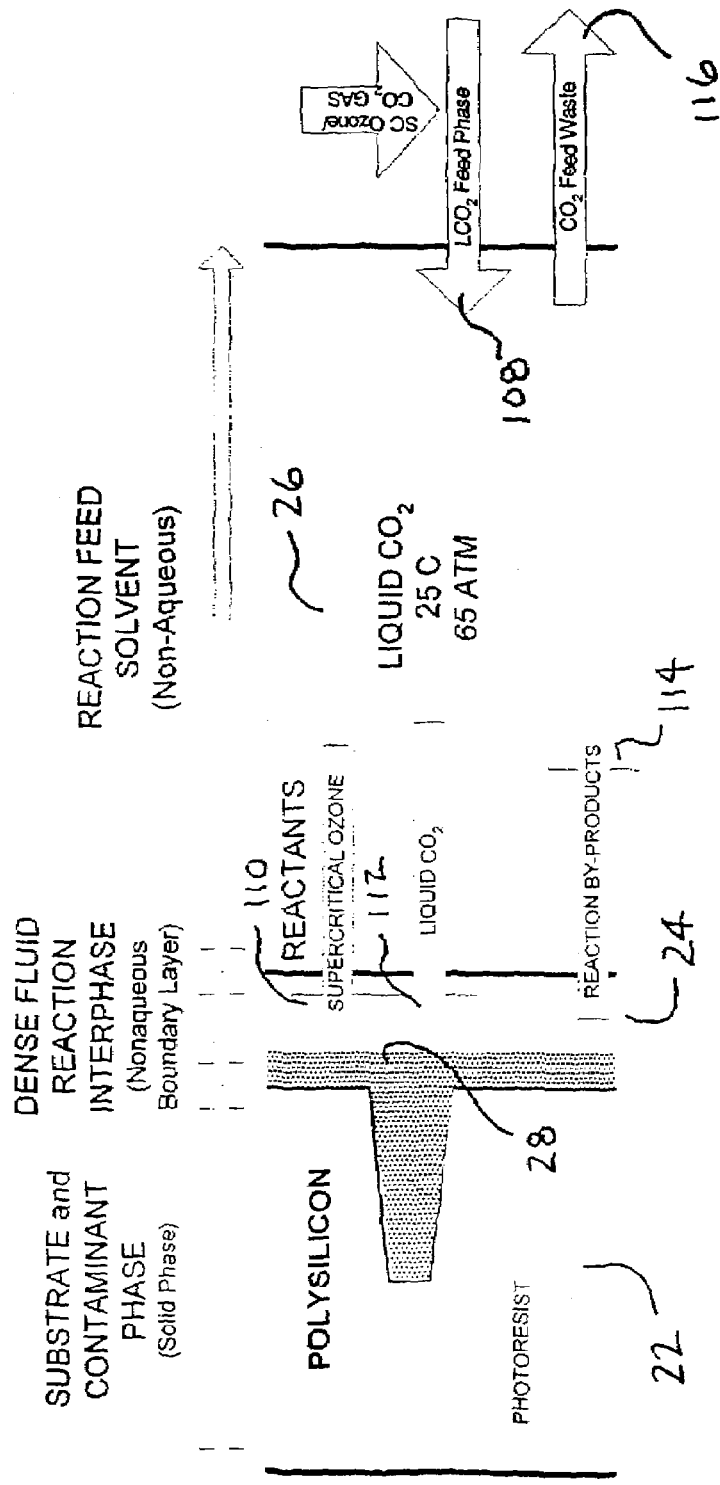
FIG. 17 is a flow diagram illustrating a fourth embodiment of the inventive process.

FIG. 17 gives an example dense fluid oxidation process of the present invention using water, liquid carbon dioxide and supercritical ozone with a modifier (hydrogen peroxide) added to the reaction feed solvent. In this example, the reactor is fluidized with deionized water containing ozone at a concentration of between 0.5% and 6.0% by volume and hydrogen peroxide at a concentration of between 0.5% and 6.0% by volume 94 and is then fluidized with carbon dioxide 96 at a reactor temperature of 28 C and pressure of 60 atm. The pH and supercritical carbon dioxide phase concentration is controlled through stoichiometric blending of ozonated deionized water, carbon dioxide and hydrogen peroxide.

Under these conditions, the substrate and contaminant phase 22 is contacted with a reaction interphase 24 comprising supercritical ozone 98, liquid carbon dioxide 100 and a small amount of dissolved hydrogen peroxide 102. The supercritical carbon dioxide component 100 permeates and swells the resist layer 28 allowing the supercritical ozone 98 to penetrate and oxidize the surface and subsurface 28 simultaneously. Hydrogen peroxide 102 promotes the reaction through the formation of hydroxyl radicals, which readily oxidize many organic contaminants. Reaction by-products 104 such as water are transported into the reaction feed solvent phase 26. Carbon dioxide formed at the reaction site is fluidized and aids in the dense fluid ozonation reaction as above. Reaction by-products are carried from the reaction interphase 24 and from the reactor 106 by removing the waste reaction feed solvent under continuous or batch operation with the simultaneous recharge of fresh reaction feed solvent 94 and carbon dioxide gas 96.

Example 4

FIG. 18 gives an example dense fluid oxidation process of the present invention using liquid carbon dioxide and supercritical ozone. In this example, the reactor is fluidized with a mixture of liquid carbon dioxide containing supercritical ozone at a concentration of between 0.5% and 6.0% by volume 108 at a reactor temperature of 25 C and pressure of 65 atm. The liquid carbon dioxide/ozone phase concentration is controlled through stoichiometric blending of ozonated carbon dioxide gas under the same pressure as its liquid (phase equilibrium line).

Under these conditions, the substrate and contaminant phase 22 is contacted with a relatively homogeneous reaction interphase 24 comprising supercritical ozone 110 and liquid carbon dioxide 112. The liquid carbon dioxide component 112 permeates and swells the resist layer 28, albeit differently from other phases and dense fluids, allowing the supercritical ozone to penetrate and oxidize the surface and subsurface simultaneously. Reaction by-products 114 such as water are transported into the reaction feed solvent phase 26. Carbon dioxide formed at the reaction site is fluidized and aids in the dense fluid ozonation reaction as above. Reaction by-products are carried from the reaction interphase 24 and from the reactor 116 by removing the waste reaction feed solvent 26 under continuous or batch operation with the simultaneous recharge of fresh reaction feed solvent 108.

The invention has been illustrated with regard to a patterned photoresist wafer cleaning technique, but it will be recognized that the invention has other applications. Merely by way of example, the invention can also be applied to the manufacture of electronic flip chip devices (defluxing), medical devices (cleaning and sterilization), processing wafers (etching), washing botannical materials (cleaning and sterilizing), and other applications requiring high purity wet processing such as steps of rinsing, cleaning, drying, and the like. As such, the present invention proposes an advanced dense fluid oxidation process for treating a variety of substrates including, but not limited to chemical etching of surfaces, cleaning substrates, defluxing electronic substrates, disinfecting and sterilizing substrates, removing photoresist polymers and particulates from substrates, removing dissolved organics and inorganics from spent acids, gross and precision drying of substrates.

Although the preferred embodiments of the present invention have been shown and described, it should be understood that various modifications and rearrangements may be resorted to without departing from the scope of the invention as disclosed herein.

The invention claimed is:

1. An apparatus for treating a substrate comprising:
   a high pressure reactor for holding the substrate to be treated, the reactor including a fluid inlet port and a fluid outlet port;
   a high pressure ozone generator connected to the fluid inlet port for producing and supplying supercritical ozone to the reactor;
   a first feed source connected to the fluid inlet port and the ozone generator for supplying supercritical oxygen to the reactor or the ozone generator; and
   a second feed source connected to the fluid inlet port for supplying a dense fluid other than supercritical oxygen to the reactor.

2. The apparatus in accordance with claim 1, further comprising:
   a feed source for deionized water;
   a mixer;
   a deionized water feed source outlet line connecting the deionized water feed source to the mixer; and
   a mixer outlet line connecting the mixer to the fluid inlet.

3. The apparatus of claim 2, further comprising a feed source for reaction modifiers and a reaction modifier feed line connecting the reaction modifier feed source to the deionized water feed source.

4. The apparatus in accordance with claim 1, further comprising a reactor heater and a reactor cooler operatively connected to the reactor.

5. The apparatus of claim 1 wherein the supercritical ozone is formed at pressures ranging from about 35 atmospheres to about 200 atmospheres.

6. The apparatus of claim 1 wherein the ozone generator comprises:
   a high pressure reaction chamber lined with an insulation sleeve;
   a first plate connectable to an electrical source and positioned within the reaction chamber; and
   a second electrically groundable plate positioned within the reaction chamber opposite the first plate wherein the electrical field forms between the first plate and the second plate by activating the electric source to pass an electrical current through the first plate.

7. The apparatus of claim 6 wherein the dense fluid ozonizer further comprises a heat exchanger to extract heat from the reaction chamber generated during the formation of the supercritical ozone.

8. The apparatus of claim 1 wherein the ozone generator comprises:
   a high pressure reaction chamber connected to the first feed source and the reactor; and
   a device to create an electrical field within the reaction chamber, whereupon activating the device, the electrical field ionizes the supercritical oxygen passing through the reaction chamber to form supercritical ozone feedable into the reactor.

9. The apparatus of claim 8 wherein the device comprises:
   a first plate connectable to an electric source and positioned partially about the reaction chamber; and
   a second electrically groundable plate positioned partially about the reaction chamber opposite the first plate wherein the electrical field forms within the reaction chamber by activating the electric source to pass an electrical current through the first plate.

10. The apparatus of claim 8 wherein the supercritical ozone is formed at pressures ranging from about 35 atmospheres to about 200 atmospheres.

11. An apparatus for treating a substrate comprising:
    a high pressure reactor for containing the substrate to be treated, the reactor having an inlet port and an outlet port;
    a first feed line connected to the inlet port for supplying the reactor with a first dense fluid;
    a second feed line connected to the inlet port for supplying the reactor with a second dense fluid; and
    a dense fluid ozonizer connected to the fluid inlet port for supplying the reactor with supercritical ozone, the dense fluid ozonizer comprising:
       a high pressure reaction chamber connected to the first feed line and the reactor; and
       a mechanism to create an electrical field within the reaction chamber, whereupon activating the mechanism, the electrical field ionizes the supercritical oxygen passing through the reaction chamber to form supercritical ozone feedable into the reactor.

12. The apparatus of claim 11 wherein the dense fluid ozonizer further comprises a heat exchanger to extract heat from the reaction chamber generated during the formation of the supercritical ozone.

13. The apparatus of claim 11 wherein the first dense fluid comprises supercritical oxygen.

14. The apparatus of claim 13 wherein the second dense fluid comprises nitrogen or carbon dioxide.

15. The apparatus of claim 11 wherein the supercritical ozone is formed at pressures ranging from about 35 atmospheres to about 200 atmospheres.

16. An apparatus for treating a substrate comprising:
    a high pressure reactor for containing the substrate to be treated, the reactor having an inlet port and an outlet port;
    a first feed line connected to the inlet port for supplying the reactor with a first dense fluid;
    a second feed line connected to the inlet port for supplying the reactor with a second dense fluid; and
    a dense fluid ozonizer connected to the first feed line and the fluid inlet port for supplying the reactor with supercritical ozone, the dense fluid ozonizer comprising:
       a high pressure reaction chamber lined with an insulation sleeve;
       a first member connectable to an electrical source and positioned within the reaction chamber; and
       a second member positioned within the reaction chamber opposite the first plate, the second plate electrically groundable, whereupon passing an electric current through the first plate an electrical field forms within the reaction chamber to ionize the first dense fluid to form supercritical ozone.

17. The apparatus of claim 16 wherein the dense fluid ozonizer further comprises a heat exchanger to extract heat from the reaction chamber generated during the formation of the supercritical ozone.

18. The apparatus of claim 16 wherein the second dense fluid comprises supercritical nitrogen or supercritical carbon dioxide.

* * * * *